(12) United States Patent
Miyazaki et al.

(10) Patent No.: US 11,953,767 B2
(45) Date of Patent: Apr. 9, 2024

(54) OPTICAL MODULATOR AND OPTICAL TRANSMISSION APPARATUS USING SAME

(71) Applicant: SUMITOMO OSAKA CEMENT CO., LTD., Tokyo (JP)

(72) Inventors: Norikazu Miyazaki, Tokyo (JP); Toru Sugamata, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 319 days.

(21) Appl. No.: 17/632,627

(22) PCT Filed: Aug. 7, 2020

(86) PCT No.: PCT/JP2020/030472
§ 371 (c)(1),
(2) Date: Feb. 3, 2022

(87) PCT Pub. No.: WO2021/025158
PCT Pub. Date: Feb. 11, 2021

(65) Prior Publication Data
US 2022/0291533 A1 Sep. 15, 2022

(30) Foreign Application Priority Data
Aug. 8, 2019 (JP) ................................ 2019-146242

(51) Int. Cl.
*G02F 1/035* (2006.01)
*G02F 1/03* (2006.01)
*G02F 1/21* (2006.01)

(52) U.S. Cl.
CPC ............ *G02F 1/035* (2013.01); *G02F 1/0316* (2013.01); *G02F 1/212* (2021.01)

(58) Field of Classification Search
None
See application file for complete search history.

(56) References Cited

U.S. PATENT DOCUMENTS 10,473,998 B2 * 11/2019 Sugamata ............. G02F 1/0327
10,921,620 B2 * 2/2021 Sugamata ............. G02F 1/0316
(Continued)

FOREIGN PATENT DOCUMENTS

JP 2009-244325 10/2009
JP 2014-199370 10/2014
(Continued)

OTHER PUBLICATIONS

International Search Report, dated Sep. 29, 2020, 3 pages.

*Primary Examiner* — Jerry Rahll
(74) *Attorney, Agent, or Firm* — Rankin, Hill & Clark LLP

(57) ABSTRACT

An optical modulator includes a relay substrate having signal conductor patterns that connect signal input terminals and signal electrodes of an optical modulation element and ground conductor patterns, and a housing, in which the signal conductor pattern includes a component mounting portion including an electrical circuit element. Two ground conductor patterns sandwiching the signal conductor pattern are formed in an asymmetrical shape in a plan view within a component mounting area having a square shape in the plan view centered on the component mounting portion. A direction of a side of the component mounting area having the square shape is same as the extending direction of the signal conductor pattern and a length of a side of the component mounting area is equal to a distance from a center of the component mounting portion to a portion on an adjacent signal conductor pattern closest to the center.

16 Claims, 18 Drawing Sheets

DETAILS OF PART A

(56) References Cited

U.S. PATENT DOCUMENTS

| | | | |
|---|---|---|---|
| 2017/0212402 A1* | 7/2017 | Ishii | H01R 24/38 |
| 2018/0059503 A1* | 3/2018 | Miyazaki | H04B 10/505 |
| 2018/0088361 A1* | 3/2018 | Sugamata | G02F 1/0327 |
| 2018/0180908 A1* | 6/2018 | Katou | G02F 1/225 |
| 2018/0231866 A1* | 8/2018 | Sugamata | G02F 1/2255 |
| 2022/0334415 A1* | 10/2022 | Miyazaki | G02F 1/0126 |

FOREIGN PATENT DOCUMENTS

| | | |
|---|---|---|
| JP | 2018-054929 | 4/2018 |
| JP | 2018-128633 | 8/2018 |
| WO | 2005/091056 | 9/2005 |

* cited by examiner

DETAILS OF PART J

OPTICAL MODULATOR AND OPTICAL TRANSMISSION APPARATUS USING SAME

TECHNICAL FIELD

The present invention relates to an optical modulator including a relay substrate that relays propagation of an electrical signal between a signal input terminal and a signal electrode of an optical modulation element, and an optical transmission apparatus using the optical modulator.

BACKGROUND ART

In high-speed/large-capacity optical fiber communication systems, optical modulators incorporating waveguide type optical modulation elements are used in many cases. Particularly, optical modulation elements using LiNbO$_3$ (hereinafter, also referred to as LN) having electro-optic effects for substrates can realize high-bandwidth optical modulation characteristics with small optical losses, so the optical modulation elements are widely used in high-speed/large-capacity optical fiber communication systems.

The optical modulation element using the LN substrate includes Mach-Zehnder type optical waveguides and signal electrodes for applying a high-frequency electrical signal as a modulation signal to the optical waveguides. Then, the signal electrodes provided in the optical modulation element are connected to lead pins and connectors that are signal input terminals provided on a housing of the optical modulator, via a relay substrate provided in the housing in which the optical modulation element is accommodated. Thus, since the lead pins and connectors that are signal input terminals are connected to a circuit substrate on which an electronic circuit for causing the optical modulator to perform a modulation operation is mounted, an electrical signal output from the electronic circuit is applied to the signal electrodes of the optical modulation element via the relay substrate.

Due to the increasing transmission capacity in recent years, the main stream of modulation methods in optical fiber communication systems is multi-level modulation and the transmission format adopting polarized wave multiplexing for multi-level modulation, such as Quadrature Phase Shift Keying (QPSK) and Dual Polarization-Quadrature Phase Shift Keying (DP-QPSK), which are used in fundamental optical transmission networks and is also being introduced into metro networks.

An optical modulator that performs QPSK modulation (QPSK optical modulator) and an optical modulator that performs DP-QPSK modulation (DP-QPSK optical modulator) include a plurality of Mach-Zehnder type optical waveguides having a so-called nested structure called a nested type, each of which includes at least one signal electrode. Therefore, the optical modulators include a plurality of signal electrodes, and the above-described DP-QPSK modulation operation is performed in cooperation with high-frequency electrical signals applied to the signal electrodes.

In such an optical modulator, an electrical circuit element such as an electric filter for improving high-frequency characteristics or the like may be mounted on a signal line formed on a relay substrate (Patent Literature Nos. 1 and 2).

FIG. 15 is a plan view illustrating an example of a configuration of an optical modulator including such a relay substrate on which an electrical circuit element is mounted in the related art. An optical modulator 2200 includes, for example, an optical modulation element 2202 which is a DP-QPSK modulator formed on an LN substrate, and a housing 2204 in which the optical modulation element 2202 is accommodated. Here, the housing 2204 includes a case 2214a and a cover 2214b. The optical modulator 2200 also includes an input optical fiber 2208 and an output optical fiber 2210 which are fixed to the case 2214a and perform an input and output of light to the optical modulation element 2202.

Four signal input terminals 2224a, 2224b, 2224c, and 2224d (hereinafter, collectively also referred to as a signal input terminal 2224) for inputting a high-frequency electrical signal for driving the optical modulation element 2202 from an external electronic circuit are further provided, in the case 2214a of the housing 2204. Specifically, the signal input terminal 2224 is, for example, a center electrode of electrical connectors 2216a, 2216b, 2216c, and 2216d (hereinafter, collectively also referred to as an electrical connector 2216) which are high-frequency coaxial connectors. The high-frequency electrical signals input from the respective signal input terminals 2224 are input to one ends of the four signal electrodes 2212a, 2212b, 2212c, and 2212d (hereinafter, collectively also referred to as a signal electrode 2212) provided in the optical modulation element 2202 via a relay substrate 2218 accommodated in the housing 2204, and terminated by a terminator 2220 with a predetermined impedance provided at the other end of the signal electrode 2212.

The optical modulation element 2202 outputs two modulated light beams from two output optical waveguides 2226a and 2226b, and the two output light beams are combined into one beam by a polarization-combining part 2228 including a polarization beam combining prism or the like. The combined light is output to the outside of the housing 2204 via the output optical fiber 2210.

FIG. 16 is a diagram illustrating the relay substrate 2218 and its periphery in the optical modulator 2200 illustrated in FIG. 15. Ground electrodes 2222a, 2222b, 2222c, 2222d, and 2222e are provided in the optical modulation element 2202 so that each of the signal electrodes 2212 constitutes a coplanar waveguide (CPW).

Further, on the relay substrate 2218, the signal conductor patterns 2230a, 2230b, 2230c, and 2230d (hereinafter, collectively also referred to as a signal conductor pattern 2230) respectively connecting the four signal input terminals 2224 and the four signal electrodes 2212 of the optical modulation element 2202 are formed. These signal conductor patterns 2230 form a high-frequency signal line together with ground conductor patterns 2240a, 2240b, 2240c, 2240d, and 2240e arranged on the relay substrate 2218 so as to sandwich the signal conductor pattern 2230 in a plane direction of the substrate.

Each of the four signal conductor patterns 2230 of the relay substrate 2218 is provided with component mounting portions 2250a, 2250b, 2250c, and 2250d (hereinafter, collectively also referred to as a component mounting portion 2250) on which an electric filter for improving high-frequency characteristics is mounted, for example. FIGS. 17 and 18 are a partial detailed view of a part J of the relay substrate 2218 illustrated in FIG. 16 and a cross-sectional view taken along arrow line XVIII-XVIII in FIG. 16. These drawings illustrate the configuration of the component mounting portion 2250b as an example of the component mounting portion 2250, and other component mounting portions 2250a, 2250c, and 2250d may have the same configuration.

The component mounting portion 2250b has, for example, the same configuration as the electric filter described in Patent Literature 1. That is, the component mounting portion 2250b includes a thin film resistor 2252b (a cross-hatched portion illustrated in FIGS. 17 and 18) formed as an electrical circuit element in a part of the signal conductor pattern 2230b, and a capacitor 2254b mounted on the signal conductor pattern 2230b. Further, the signal conductor pattern 2230b of the component mounting portion 2250b is formed wider than, for example, other portions.

The thin film resistor 2252b is formed with a portion of the signal conductor pattern 2230b with a desired thickness so that the portion has a desired resistance value, and is formed to be thinner than the thickness of the other portion, for example. Further, the capacitor 2254b is, for example, a single plate capacitor, and a lower surface electrode portion of the capacitor is fixed on a wide portion of the signal conductor pattern 2230b connected to one end of the thin film resistor 2252b, for example, by soldering. On the other hand, an upper surface electrode of the capacitor 2254b is connected over the wide portion of the signal conductor pattern 2230b connected to the other end of the thin film resistor 2252b, for example, by wire bonding using a conductor wire 2270. Thus, the component mounting portion 2250b constitutes an electric filter in which the thin film resistor 2252b and the capacitor 2254b are connected in parallel.

Incidentally, the DP-QPSK optical modulator as described above is often used at a transmission rate of 100 Gb/s at present, and development to expand this transmission rate to 400 Gb/s is also in progress. With the increase in the frequency of the modulator operation, components with excellent high-frequency characteristics can be selected as the electrical circuit elements (capacitor 2254b or the like) mounted on the component mounting portion 2250 as described above, or the impedance of the component mounting portion 2250 is matched with the line impedance of the signal conductor pattern 2230.

However, the component mounting portion 2250 described above can be a discontinuity point for a high-frequency (microwave) electrical signal propagating in the signal conductor pattern 2230 due to, for example, a difference in physical shape between the electrical circuit element and the signal conductor pattern 2230, displacement of a mounting position of the electrical circuit element, and the like. As a result, a part of the microwave electrical signal leaks from the component mounting portion 2250 and becomes a leaked microwave 2290 (FIG. 16), which can act as noise on the adjacent signal conductor pattern 2230 and the signal electrode 2212 on the optical modulation element 2202.

In particular, in an optical modulator such as the optical modulator 2200 in which high-frequency electrical signals given to a plurality of signal electrodes 2212 cooperate to perform DP-QPSK modulation, it is desirable that all the high-frequency electrical signals are input to the signal electrode 2212 of the optical modulation element 2202 without being affected by noise or the like, and the generation of noise as described above may adversely affect the operation of the optical modulation element 2202.

Further, the demand for miniaturization of the optical modulator 2200 remains unchanged, and the relay substrate 2218 is being miniaturized along with the miniaturization of the housing 2204 of the optical modulator 2200. As a result, a plurality of different high-frequency signals are propagated in close proximity to each other in the narrow relay substrate 2218, and electrical crosstalk between high-frequency signal lines such as the signal conductor pattern 2230 due to leaked microwaves as described above cannot be ignored.

That is, in an optical modulator in the related art, it is required to reduce crosstalk between high-frequency electrical signals caused by leaked microwaves that may occur from component mounting portion provided on the relay substrate and to realize appropriate modulation characteristics.

CITATION LIST

Patent Literature

[Patent Literature No. 1] Japanese Laid-open Patent Publication No. 2009-244325
[Patent Literature No. 2] Japanese Laid-open Patent Publication No. 2018-54929

SUMMARY OF INVENTION

Technical Problem

From the above background, in an optical modulator, it is required to effectively suppress the influence of leaked microwaves which may be generated from a portion of a relay substrate that electrically connects each of signal electrodes of an optical modulation element and each of signal input terminals, and that is provided with an electrical circuit element constituting an electric filter or the like, and to realize appropriate optical modulation characteristics.

Solution to Problem

According to one aspect of the present invention, there is provided an optical modulator including: an optical modulation element that includes a plurality of signal electrodes; a plurality of signal input terminals each of which inputs an electrical signal to be applied to each of the signal electrodes; a relay substrate on which a plurality of signal conductor patterns that electrically connect the signal input terminals to the signal electrodes, and a plurality of ground conductor patterns are formed; and a housing in which the optical modulation element and the relay substrate are accommodated, in which at least one signal conductor pattern includes at least one component mounting portion including an electrical circuit element, two ground conductor patterns sandwiching the at least one signal conductor pattern on the relay substrate are formed in an asymmetrical shape in a plan view within a component mounting area having a square shape in the plan view centered on the component mounting portion, with respect to a straight line extending in an extending direction of the at least one signal conductor pattern in the component mounting portion, and a direction of a side of the component mounting area having the square shape is same as the extending direction of the at least one signal conductor pattern in the component mounting portion and a length of a side of the component mounting area is equal to a distance from a center of the component mounting portion to a portion on an adjacent signal conductor pattern closest to the center.

According to another aspect of the present invention, there is provided an optical modulator including: an optical modulation element that includes a plurality of signal electrodes; a plurality of signal input terminals each of which inputs an electrical signal to be applied to each of the signal electrodes; a relay substrate on which a plurality of signal conductor patterns that electrically connect the signal input terminals to the signal electrodes, and a plurality of ground conductor patterns are formed; and a housing in which the optical modulation element and the relay substrate are accommodated, in which at least one signal conductor pattern includes at least one component mounting portion including an electrical circuit element, two ground conductor patterns sandwiching the at least one signal conductor pattern on the relay substrate are formed asymmetrically within a component mounting area having a square shape in the plan view centered on the component mounting portion, in terms of a presence or absence of vias, diameters of vias, or the numbers of vias, and a direction of a side of the component mounting area having the square shape is same as the extending direction of the at least one signal conductor pattern in the component mounting portion and a length of a side of the component mounting area is equal to a distance from the at least one signal conductor pattern to a closest adjacent signal conductor pattern.

According to still another aspect of the present invention, the two ground conductor patterns are formed to have portions in which distances from respective edges of the two ground conductor patterns to opposite edges of the at least one signal conductor pattern are different from each other in the component mounting area.

According to still another aspect of the present invention, one ground conductor pattern of the two ground conductor patterns includes a portion in which a width measured in a direction orthogonal to the extending direction of the at least one signal conductor pattern is narrower than a width of an other ground conductor pattern of the two ground conductor patterns, in the component mounting area.

According to still another aspect of the present invention, one ground conductor pattern of the two ground conductor patterns has a discontinuous section in the component mounting area, and an other ground conductor pattern does not have a discontinuous section in the component mounting area.

According to still another aspect of the present invention, the other ground conductor pattern of the two ground conductor patterns has a portion in which a separation distance to a portion of the signal conductor pattern constituting the component mounting portion is formed longer than a separation distance to other portions of the signal conductor pattern within a corresponding component mounting area.

According to still another aspect of the present invention, the optical modulation element is configured to generate two modulated light beams, each of which is modulated by a pair of the electrical signals, and the relay substrate is configured to propagate the pair of electrical signals by a pair of the signal conductor patterns adjacent to each other.

According to still another aspect of the present invention, there is provided an optical transmission apparatus including any one of the optical modulators described above and an electronic circuit that outputs an electrical signal for causing the optical modulator to perform a modulation operation.

Advantageous Effects of Invention

According to the present invention, it is possible to effectively suppress the influence of leaked microwaves that may be generated from the component mounting portion provided with the electrical circuit element in the relay substrate, and to realize appropriate optical modulation characteristics.

This application claims the benefit of Japanese Patent Application No. 2019-146242 filed on Aug. 8, 2019, the disclosure of which is herein incorporated by reference in its entirety.

DESCRIPTION OF EMBODIMENTS

The present invention changes a direction of microwaves that can leak at a component mounting portion of a relay substrate by making an electrode configuration around the component mounting portion asymmetric, and reduces the influence on its own signal electrode, adjacent signal electrodes, and the like. Specifically, optical modulators illustrated in the following embodiments and modification examples thereof include an optical modulation element and a relay substrate provided with a component mounting portion including an electrical circuit element. Then, in these optical modulators, in order to solve the above-described problems, in a predetermined component mounting area of at least one signal conductor pattern provided with a component mounting portion, two ground conductor patterns sandwiching the at least one signal conductor pattern are formed asymmetrically with respect to an extending direction of the signal conductor pattern. Specifically, in the component mounting area, separation distances between the signal conductor pattern and the two adjacent ground conductor patterns are asymmetrical to each other, the widths of the two ground conductor patterns are asymmetrical to each other, or the presence or absence of vias, the diameters of vias, and the numbers of vias in the two ground conductor patterns are different from each other. Thus, in the optical modulator, the intensity of leaked microwave generated from the component mounting portion toward the adjacent signal conductor pattern is reduced, and crosstalk between the adjacent signal conductor patterns is reduced.

Hereinafter, embodiments of the present invention will be described with reference to the drawings.

First Embodiment

Figure 1:
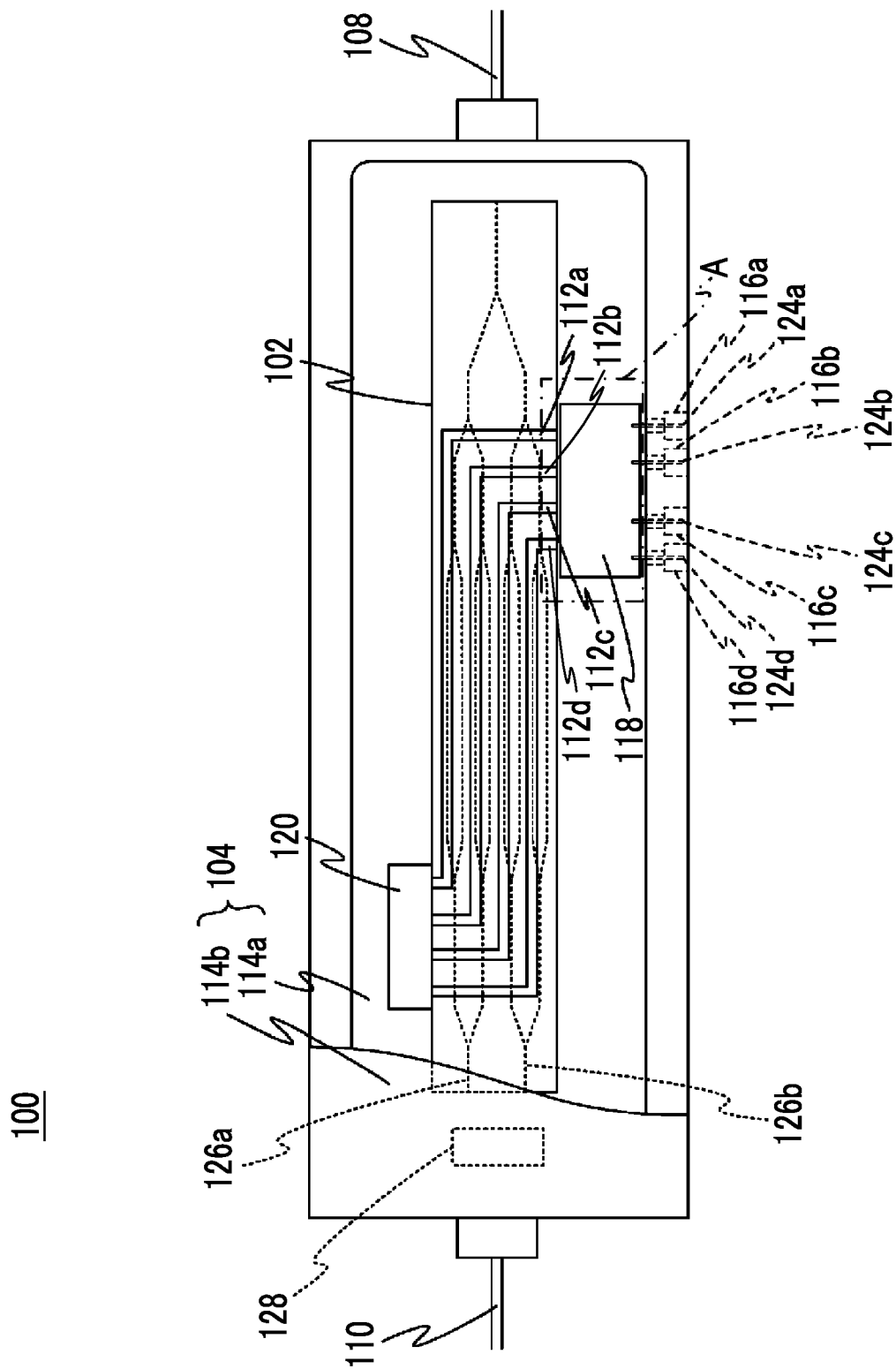
FIG. 1 is a plan view of an optical modulator according to a first embodiment of the present invention.
Figure 2:
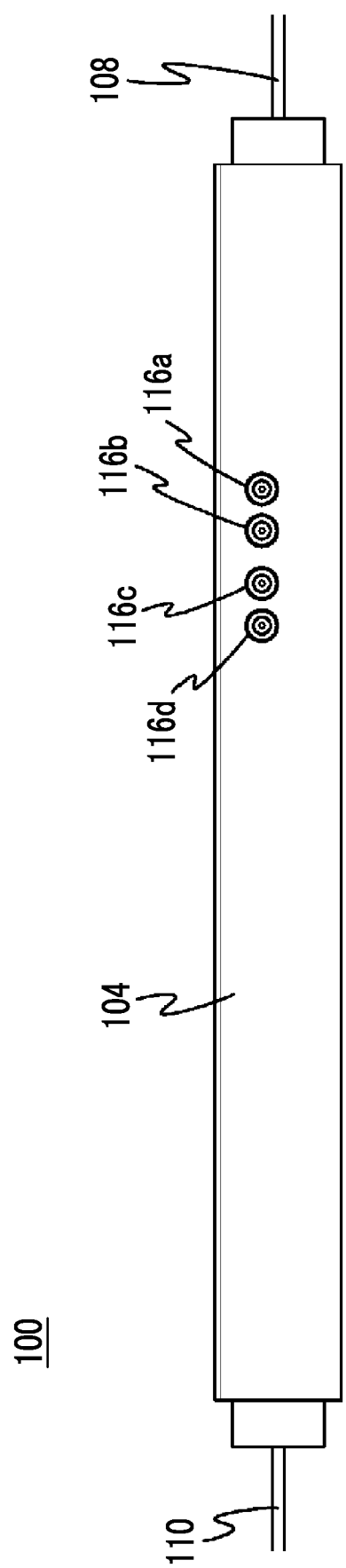
FIG. 2 is a side view of the optical modulator illustrated in FIG. 1.
Figure 3:
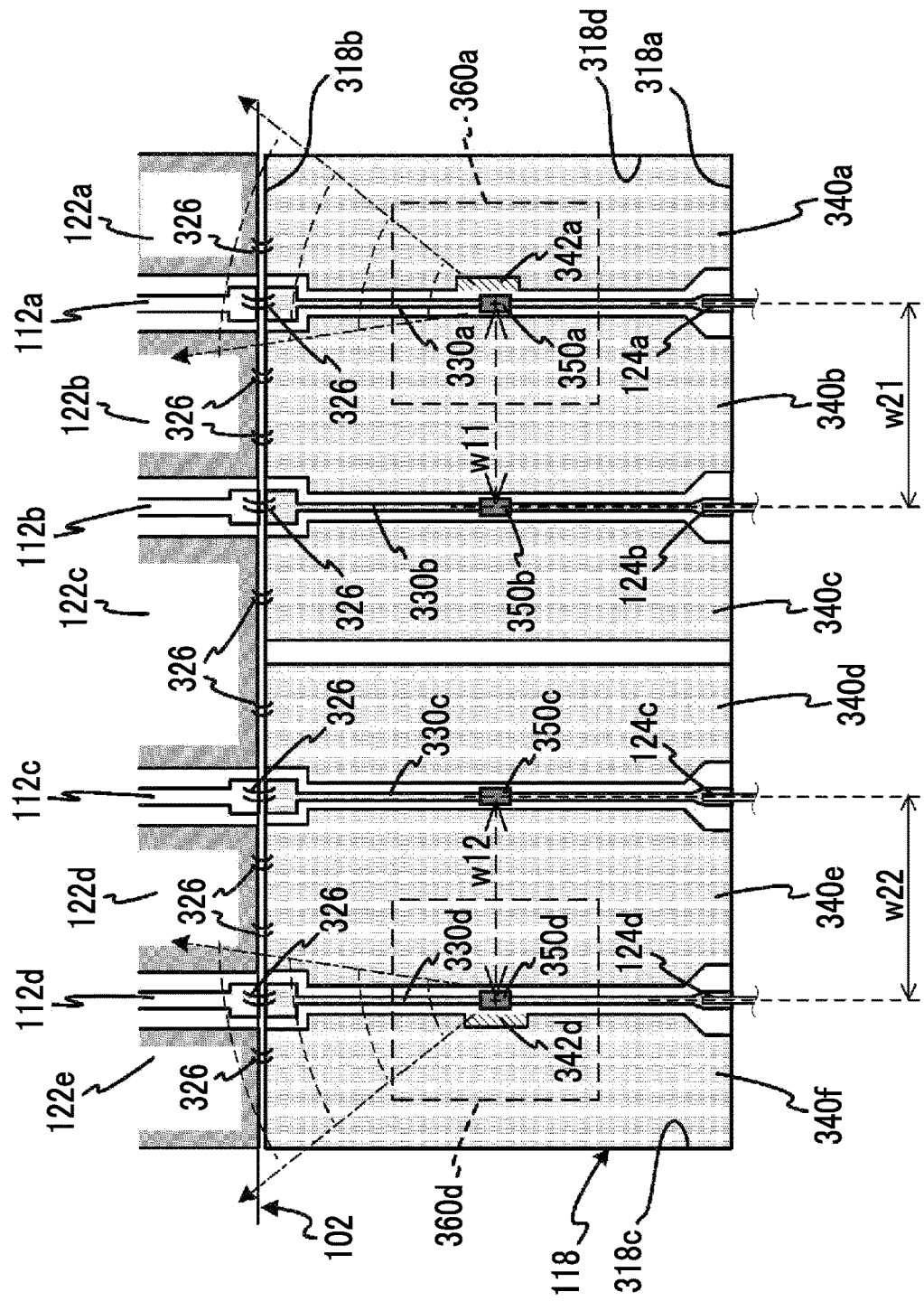
FIG. 3 is a detail view of a part A of the optical modulator illustrated in FIG. 1.

First, a first embodiment of the present invention will be described. FIG. 1 is a plan view illustrating a configuration of an optical modulator 100 according to the first embodiment of the present invention, FIG. 2 is a side view of the optical modulator 100, and FIG. 3 is a partial detailed view of a part A in FIG. 1.

The optical modulator 100 includes an optical modulation element 102, a housing 104 in which the optical modulation element 102 is accommodated, an input optical fiber 108 for inputting light into the optical modulation element 102, and an output optical fiber 110 that guides the light output from the optical modulation element 102 to the outside of the housing 104.

The optical modulation element 102 is, for example, a DP-QPSK modulator that performs optical modulation of 400 Gb/s, and includes, for example, four Mach-Zehnder type optical waveguides provided on an LN substrate. The four Mach-Zehnder type optical waveguides are provided with four signal electrodes 112a, 112b, 112c, and 112d (hereinafter, collectively also referred to as a signal electrode 112) that respectively modulate light waves propagating through the Mach-Zehnder type optical waveguide. In addition, as known in the related art, on a surface of the LN substrate of the optical modulation element 102, for example, ground electrodes 122a, 122b, 122c, 122d, and 122e (see FIG. 3 and not illustrated in FIG. 1) are provided so that each of the four signal electrodes 112a, 112b, 112c, and 112d includes a coplanar waveguide (CPW).

Specifically, the ground electrodes 122a, 122b, 122c, 122d, and 122e (hereinafter, collectively also referred to as a ground electrode 122) are disposed to respectively sandwich the signal electrodes 112a, 112b, 112c, and 112d therebetween in a surface of the LN substrate, and constitute a coplanar waveguide having a predetermined characteristic impedance in a predetermined operating frequency together with the four signal electrodes 112a, 112b, 112c, and 112d.

Four high-frequency electrical signals (modulation signals) are respectively input to the four signal electrodes 112. These high-frequency electrical signals cooperate to control the propagation of the light wave in the four Mach-Zehnder type optical waveguides, and perform the operation of DP-QPSK modulation of 400 Gb/s as a whole.

Specifically, two pairs of high-frequency electrical signals, one pair of which includes two high-frequency electrical signals, are applied to the four respective signal electrodes 112. The optical modulation element 102 is configured to generate two modulated light beams each of which is modulated by one pair of electrical signals. The two generated modulated light beams are respectively output from two output optical waveguides 126a and 126b that form a part of the optical modulation element 102. In the present embodiment, two high-frequency electrical signals forming one pair are applied to the signal electrodes 112a and 112b to generate modulated light output from the output optical waveguide 126a, and other two high-frequency electrical signals forming another pair are applied to the signal electrodes 112c and 112d to generate modulated light output from the output optical waveguide 126b. These two modulated light beams are combined into one beam by a polarization-combining part 128 including a polarization beam combining prism or the like, and then output to the outside of the housing 104 via the output optical fiber 110.

The housing 104 includes a case 114a to which the optical modulation element 102 is fixed and a cover 114b. In order to facilitate understanding of the configuration inside the housing 104, only a part of the cover 114b is illustrated on the left side in FIG. 1, but actually, the cover 114b is disposed to cover the entire box-shaped case 114a and hermetically seals the inside of the housing 104. The case 114a is made of a metal or a ceramic plated with gold, for example, and functions electrically as an electric conductor. The housing 104 can be usually provided with a plurality of pins for DC control or the like, which are omitted in FIG. 1.

In the case 114a, electrical connectors 116a, 116b, 116c, and 116d (hereinafter, collectively also referred to as electrical connectors 116), which are coaxial connectors including signal input terminals 124a, 124b, 124c, and 124d (hereinafter, collectively also referred to as a signal input terminal 124) that input the high-frequency electrical signal to be applied to each of the signal electrodes 112a, 112b, 112c, and 112d of the optical modulation element 102 are provided.

Each of the electrical connectors 116 is, for example, a socket for a push-on coaxial connector, including a cylindrical ground conductor, and the signal input terminal 124 includes a center conductor (core wire) extending along a center line of the cylindrical ground conductor. Each of the cylindrical ground conductors is electrically connected and fixed to the case 114a. Therefore, the case 114a constitutes a part of a ground line that supplies a ground potential. Further, each of the signal input terminals 124 is electrically connected to one end of each of the signal electrodes 112 of the optical modulation element 102, via a relay substrate 118.

The other end of the signal electrode 112 of the optical modulation element 102 is terminated by a terminator 120 having a predetermined impedance. Thus, the electrical signals input to the one ends of the signal electrodes 112 respectively propagate in the signal electrodes 112 as traveling waves.

FIG. 3 illustrates a configuration of the relay substrate 118 and its surroundings. On the relay substrate 118, signal conductor patterns 330a, 330b, 330c, and 330d (hereinafter, collectively also referred to as a signal conductor pattern 330) and ground conductor patterns 340a, 340b, 340c, 340d, 340e, and 340f (hereinafter, collectively also referred to as a ground conductor pattern 340) are formed.

On the relay substrate 118, a rear surface ground conductor (not illustrated) is formed on, for example, the entire surface of a rear surface facing a front surface (a surface illustrated in FIG. 3 in which the signal conductor pattern 330 and the ground conductor pattern 340 are formed). The rear surface ground conductor is fixed to the case 114a of the housing 104 with, for example, solder, a brazing material, a conductive adhesive, or the like. Thus, the rear surface ground conductor becomes a ground line component. Each of the ground conductor patterns 340 is connected to the rear surface ground conductor and connected to the ground line through an appropriate via (not illustrated).

The ground conductor patterns 340a, 340b, 340c, 340d, 340e, and 340f are respectively provided to sandwich the signal conductor patterns 330a, 330b, 330c, and 330d in a front surface of the relay substrate 118. Thus, each of the signal conductor patterns 330 and the ground conductor pattern 340 form a coplanar waveguide.

In the present embodiment, the signal conductor pattern 330 extends in an upward-downward direction illustrated in FIG. 3, and among sides of the relay substrate 118, one end of a side on a lower side illustrated in FIG. 3 is connected to the signal input terminal 124. Here, among the sides of the relay substrate 118, a side on which the signal conductor pattern 330 and the signal input terminal 124 are connected is referred to as a signal input side 318a.

Each of the signal electrodes 112 of the optical modulation element 102 is electrically connected to another end of the signal conductor pattern 330 of the relay substrate 118, on an upper side illustrated in FIG. 3 among sides of the relay substrate 118, by wire bonding using a conductor wire 326, for example. The conductor wire 326 can be a gold wire, for example. Here, among the sides of the relay substrate 118, a side on which the signal conductor pattern 330 and the signal electrode 112 of the optical modulation element 102 are connected is referred to as a signal output side 318b. In the present embodiment, the signal input side 318a and the signal output side 318b form two sides facing each other in the relay substrate 118 in a plan view. Among the sides of the relay substrate 118 in FIG. 3, the other two sides facing each other, other than the signal input side 318a and the signal output side 318b are referred to as side edges (lateral sides) 318c and 318d.

In the optical modulation element 102, the respective ground electrodes 122 that constitute the coplanar waveguide together with the signal electrodes 112 are electrically connected to one ends of the respective ground conductor patterns 340 at the signal output side 318b of the relay substrate 118, by wire bonding using the conductor wires 326, for example, in the same manner as described above. The wire bonding using the conductor wire 326 described above is an example, and the present invention is not limited thereto. Instead of wire bonding of the conductor wire 326, for example, ribbon bonding using a conductor ribbon such as a gold ribbon can be used.

The signal conductor patterns 330a, 330b, 330c, and 330d include, for example, component mounting portions 350a, 350b, 350c, and 350d (hereinafter, collectively also referred to as a component mounting portion 350) which are portions (dark shaded portions illustrated in FIG. 3) provided with an electrical circuit element constituting an electric filter, respectively. Here, the electrical circuit element refers to an active element and/or a passive element serving as a functional element constituting the circuit, and does not include a wire pattern or a land (solder) provided exclusively for electrical connection.

Figure 17:
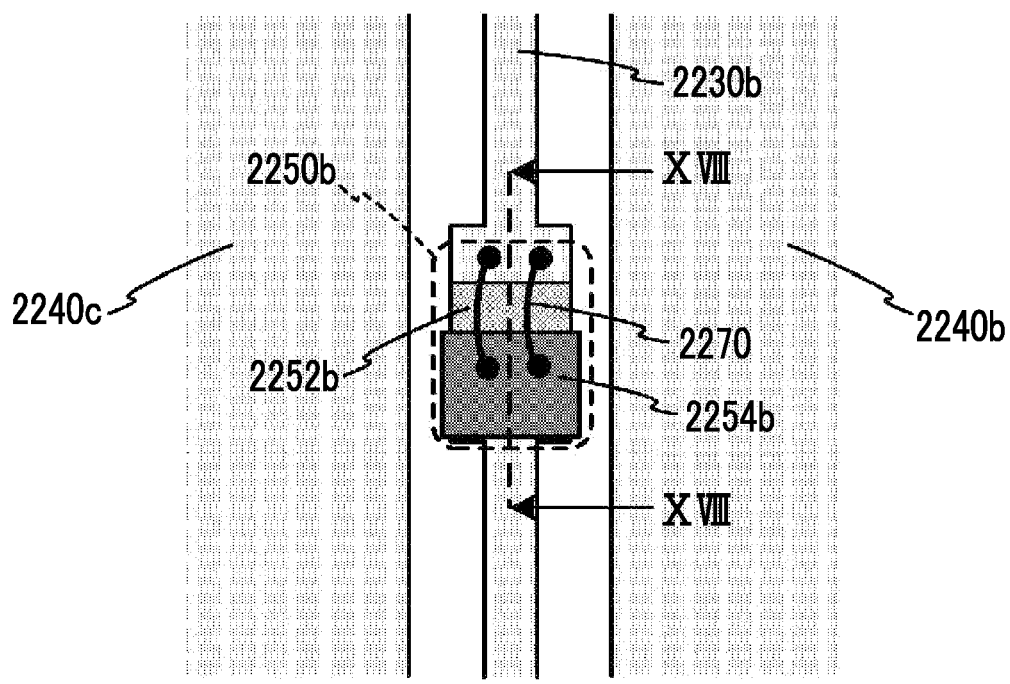
FIG. 17 is a partial detailed view illustrating the details of a part J illustrated in FIG. 16.

For example, similar to the component mounting portion 2250 illustrated in FIGS. 17 and 19, the component mounting portion 350 may be configured by mounting an electrical circuit element such as a capacitor and/or forming an electrical circuit element such as a thin film resistor on a portion of the signal conductor pattern 330 provided wider than the others. That is, for example, similar to the signal conductor pattern 2230b illustrated in FIGS. 17 and 19, a wide portion is formed in the signal conductor pattern 330, a capacitor similar to the capacitor 2254b is mounted, and a thin film resistor similar to the thin film resistor 2252b is formed in a part of the wide portion of the signal conductor pattern 330, thereby configuring the component mounting portion 350.

In the present embodiment, in particular, the two ground conductor patterns 340a and 340b sandwiching the signal conductor pattern 330a on the relay substrate 118 are formed in an asymmetrical shape in a plan view within a component mounting area 360a having a square shape in the plan view centered on the component mounting portion 350a, with respect to a straight line extending in an extending direction of the signal conductor pattern 330a in the component mounting portion 350a.

Further, the component mounting area 360a is defined as an area having a square shape in the plan view in which a direction of a side of the component mounting area having the square shape is same as the extending direction of the at least one signal conductor pattern 330a in the component mounting portion 350a and a length of a side of the component mounting area is equal to a distance (pitch) W11 from the center of the component mounting portion 350a to a portion on the adjacent signal conductor pattern 330b closest to the center thereof (for example, the center in a width direction of the signal conductor pattern 330b in the portion).

Here, the center of the component mounting portion 350 may be the center of any of the electrical circuit elements included in the component mounting portion 350, or the center of the circumscribed rectangle (described later) including the electrical circuit elements constituting the component mounting portion 350. In FIG. 3, for the sake of description, it is assumed that a boundary line in the width direction (a boundary line between the left and right illustrated in FIG. 3) of the component mounting portion 350 indicates an edge position in the width direction of the corresponding signal conductor pattern 330 in the component mounting portion 350. Further, in FIG. 3, the width of the portion of the signal conductor pattern 330 in the component mounting portion 350 is wider than that of the other portion, but the width is not limited thereto. The width of the portion of the signal conductor pattern 330 in the component mounting portion 350 may be the same as that of the other portion or may have a narrower width than the other portion.

In the present embodiment, since the ground conductor pattern 340a has a notched portion 342a (hatched portion illustrated in FIG. 3), the ground conductor patterns 340a and 340b are formed such that separation distances (gaps) from respective edges of the ground conductor patterns 340a and 340b to opposite edges of the signal conductor pattern 330a have different portions (that is, asymmetrical portions) in the component mounting area 360a. Further, in the present embodiment, since the signal conductor pattern 330 is formed parallel to the side edge 318d and linearly, a length w11 of one side of the component mounting area 360a is equal to a distance (pitch) w21 between a center line in the width direction of the signal conductor pattern 330a and a center line in the width direction of the signal conductor pattern 330b. That is, w11=w21.

The signal conductor pattern 330a and the ground conductor patterns 340a and 340b can be formed such that the characteristic impedance of the signal conductor pattern 330a becomes a predetermined value, for example, inside and outside the component mounting portion 350a by adjusting a clearance (separation distance) between the conductor patterns, a formation width of the signal conductor pattern 330a, and the like.

In general, in a high-frequency signal line including a signal conductor and a ground conductor, the smaller the distance between the signal conductor and the ground conductor, the stronger the confinement of the high-frequency signal in the signal conductor.

In the relay substrate 118, there are portions where separation distances from the signal conductor pattern 330a to the ground conductor patterns 340a and 340b are different from each other in the component mounting area 360a. Therefore, the leaked microwave generated from the component mounting portion 350a is biased in a direction in which the separation distance from the adjacent ground conductor pattern is large, that is, in the direction of the ground conductor pattern 340a (for example, in FIG. 3, in a direction area sandwiched by arrows of two alternate long and short dash lines extending from the component mounting portion 350a) and emitted to have a higher intensity than the other directions.

On the other hand, since the signal conductor pattern 330a can be configured to have, for example, the same characteristic impedance inside and outside the component mounting area 360a, the total amount of leaked microwaves generated from the component mounting portion 350a is almost the same as a case where the ground conductor patterns 340a and 340b are formed symmetrically.

As a result, the intensity of the leaked microwave in a direction other than the direction area sandwiched by the arrows of the alternate long and short dash lines is relatively reduced, and crosstalk from the signal conductor pattern 330a to the signal conductor pattern 330b due to the leaked microwave generated from the component mounting portion 350a is reduced.

Similarly, in the present embodiment, since the ground conductor pattern 340f has a notched portion 342d (hatched portion illustrated in FIG. 3), the ground conductor patterns 340e and 340f are configured such that separation distances (gaps) from respective edges of the ground conductor patterns 340e and 340f to opposite edges of the signal conductor pattern 330d have different portions in the component mounting area 360d.

Here, the component mounting area 360d is defined as an area having a square shape in the plan view in which a direction of a side of the component mounting area having the square shape is same as the extending direction of the at least one signal conductor pattern 330d in the component mounting portion 350d and a length of a side of the component mounting area is equal to a distance (pitch) W12 from the center of the component mounting portion 350d to a portion on the adjacent signal conductor pattern 330c closest to the center thereof (for example, the center in a width direction of the signal conductor pattern 330c in the portion). In the present embodiment, since the signal conductor pattern 330 is formed parallel to the side edge 318d and linearly, a length w12 of one side of the component mounting area 360d is equal to a distance (pitch) w22 between a center line in the width direction of the signal conductor pattern 330d and a center line in the width direction of the signal conductor pattern 330c. That is, w12=w22.

Thus, the ground conductor patterns 340e and 340f are formed in an asymmetrical shape in a plan view with respect to the straight line extending in the extending direction of the signal conductor pattern 330d in the component mounting portion 350d, in the component mounting area 360d. Therefore, the leaked microwave generated from the component mounting portion 350d has a higher intensity than the other directions in the direction area sandwiched by the arrows of the two alternate long and short dash lines extending from the component mounting portion 350d in FIG. 3, for example. As a result, crosstalk from the signal conductor pattern 330d to the signal conductor pattern 330c due to the leaked microwave generated from the component mounting portion 350d is reduced.

In particular, in an optical modulator that generates two modulated light beams, each of which is modulated by a pair of high-frequency electrical signals, such as the optical modulator 100 that performs DP-QPSK modulation, the two paired high-frequency electrical signals often carry information for a phase difference between them. Therefore, crosstalk between the two paired high-frequency electrical signals also generates a phase noise in addition to an intensity noise, and can have a greater influence on the modulation characteristics of the optical modulator 100 than crosstalk between unpaired high-frequency electrical signals.

Since the paired high-frequency electrical signals are generally relayed by using two adjacent signal conductor patterns on the relay substrate, it is extremely important to suppress such crosstalk between two adjacent signal conductor patterns.

The optical modulator 100 of the present embodiment is configured to respectively propagate two high-frequency electrical signals forming one pair of the two pairs of high-frequency electrical signals by the adjacent signal conductor patterns 330a and 330b, and to propagate an other two paired high-frequency electrical signals, by the other adjacent signal conductor patterns 330c and 330d. Then, with the above configuration, the crosstalk from the signal conductor pattern 330a to the signal conductor pattern 330b, that is, crosstalk from one of the two high-frequency electrical signals forming one pair to the other is reduced. Further, with the above configuration, the crosstalk from the signal conductor pattern 330d to the signal conductor pattern 330c, that is, crosstalk from one of the two high-frequency electrical signals forming the other pair to the other is also reduced. As a result, the optical modulator 100 can effectively reduce the influence of leaked microwaves and realize appropriate optical modulation characteristics.

Figure 4:
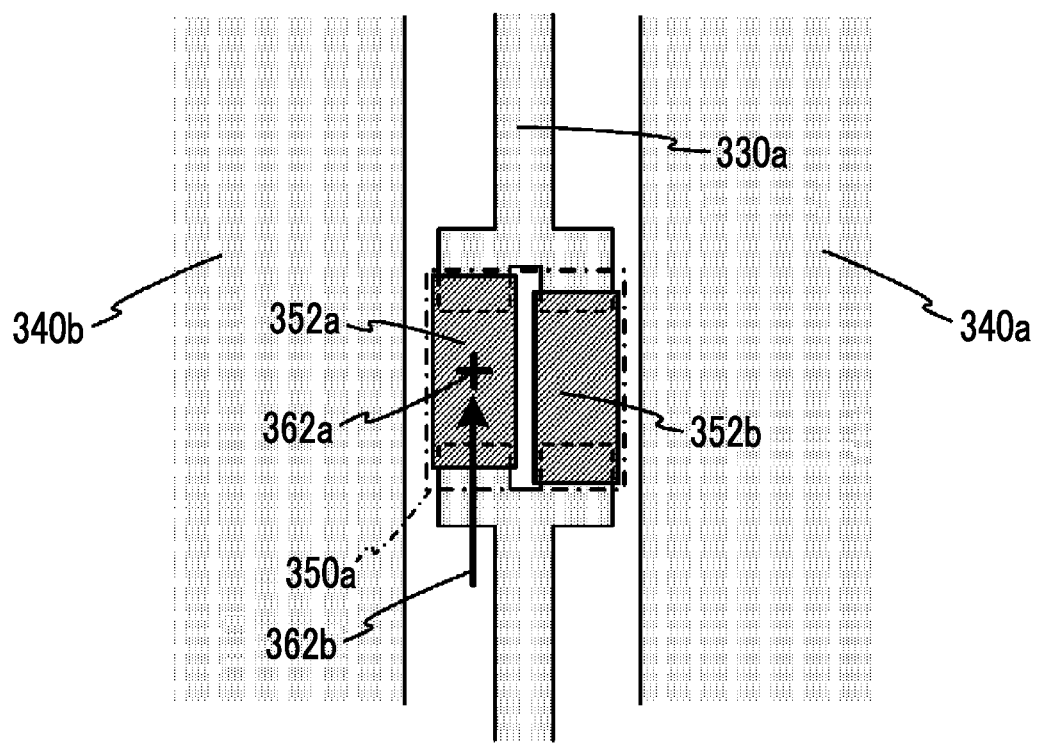
FIG. 4 is a diagram illustrating another example of a component mounting portion.
Figure 18:
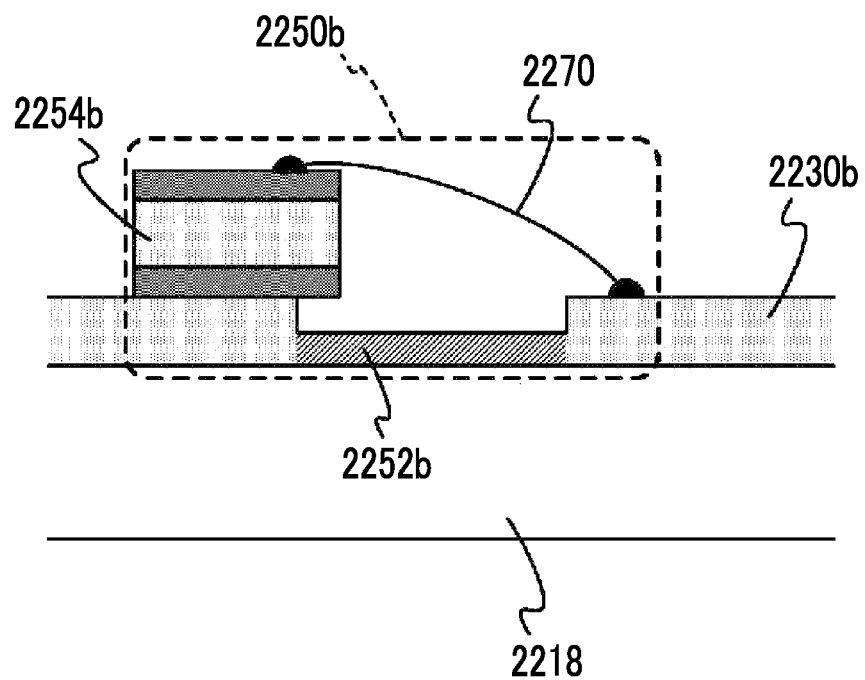
FIG. 18 is a cross-sectional view taken along arrow line XVIII-XVIII of the partial detailed view illustrated in FIG. 17.

In the present embodiment, it is assumed that the component mounting portion 350 has the same configuration as the component mounting portion 2250b illustrated in FIGS. 17 and 18, but the present invention is not limited thereto. As illustrated in FIG. 4, the component mounting portion 350 may include, for example, electrical circuit elements 352a and 352b, which are two chip components connected in parallel to each other in the plane direction of the relay substrate, which are inserted by dividing the signal conductor pattern 330a. In this case, the area of the component mounting portion 350 can be the area of the circumscribed rectangle (rectangle of the alternate long and short dash line illustrated in FIG. 4) including the electrical circuit elements 352a and 352b constituting the component mounting portion 350.

In this case, the center of the component mounting portion 350a can be the center of the rectangle of the alternate long and short dash line indicating the area of the component mounting portion 350a. Alternatively, the center of any of the shapes of the plurality of electrical circuit elements 352a and 352b constituting the component mounting portion 350a (for example, the shape center 362a of the electrical circuit element 352a indicated by the plus sign in FIG. 4) may be the center of the component mounting portion 350a.

Further, as described above, the extending direction of the signal conductor pattern 330 in the component mounting portion 350 when the signal conductor pattern 330 has a divided portion in the component mounting portion 350 can be a propagation direction of the high-frequency signal flowing from the signal conductor pattern 330 or a propagation direction of the high-frequency signal flowing out to the signal conductor pattern 330 for any of the electrical circuit elements included in the component mounting portion 350. In FIG. 4, as an example, a propagation direction 362b of the high-frequency signal flowing from the signal conductor pattern for the electrical circuit element 352a is drawn as the extending direction of the signal conductor pattern 330a in the component mounting portion 350a.

In the present embodiment, the separation distances between the signal conductor pattern 330 and the two ground conductor patterns 340 are formed asymmetrically in the two component mounting areas 360a and 360d defined for the two signal conductor patterns 330a and 330d. However, the present invention is not limited thereto. Further, one signal conductor pattern 330 may be provided with a plurality of component mounting portions 350 and a component mounting area 360, and as illustrated in FIG. 3, each of the four signal conductor patterns may be provided with the component mounting portions 350 and the component mounting areas 360. Therefore, the separation distances can be configured to be asymmetrical to each other in the at least one component mounting area 360 of the at least one signal conductor pattern 330 according to the generation state of the leaked microwave on the relay substrate 118.

As described above, the component mounting area 360 is defined as "an area having a square shape in the plan view in which a direction of a side of the component mounting area having the square shape is same as the extending direction of the at least one signal conductor pattern 330 in the component mounting portion 350 and a length of a side of the component mounting area is equal to a distance from the center of the component mounting portion 350 to a portion on the adjacent signal conductor pattern 330 closest to the center thereof". This is because an effective electric field of microwaves is distributed in this area and it is possible to effectively affect an effective electric field profile of microwaves by making the electrode configuration asymmetric in this portion, and as a result, the direction of the leaked microwave can be effectively adjusted.

Next, a modification example of the relay substrate used in the optical modulator 100 will be described.

First Modification Example

Figure 5:
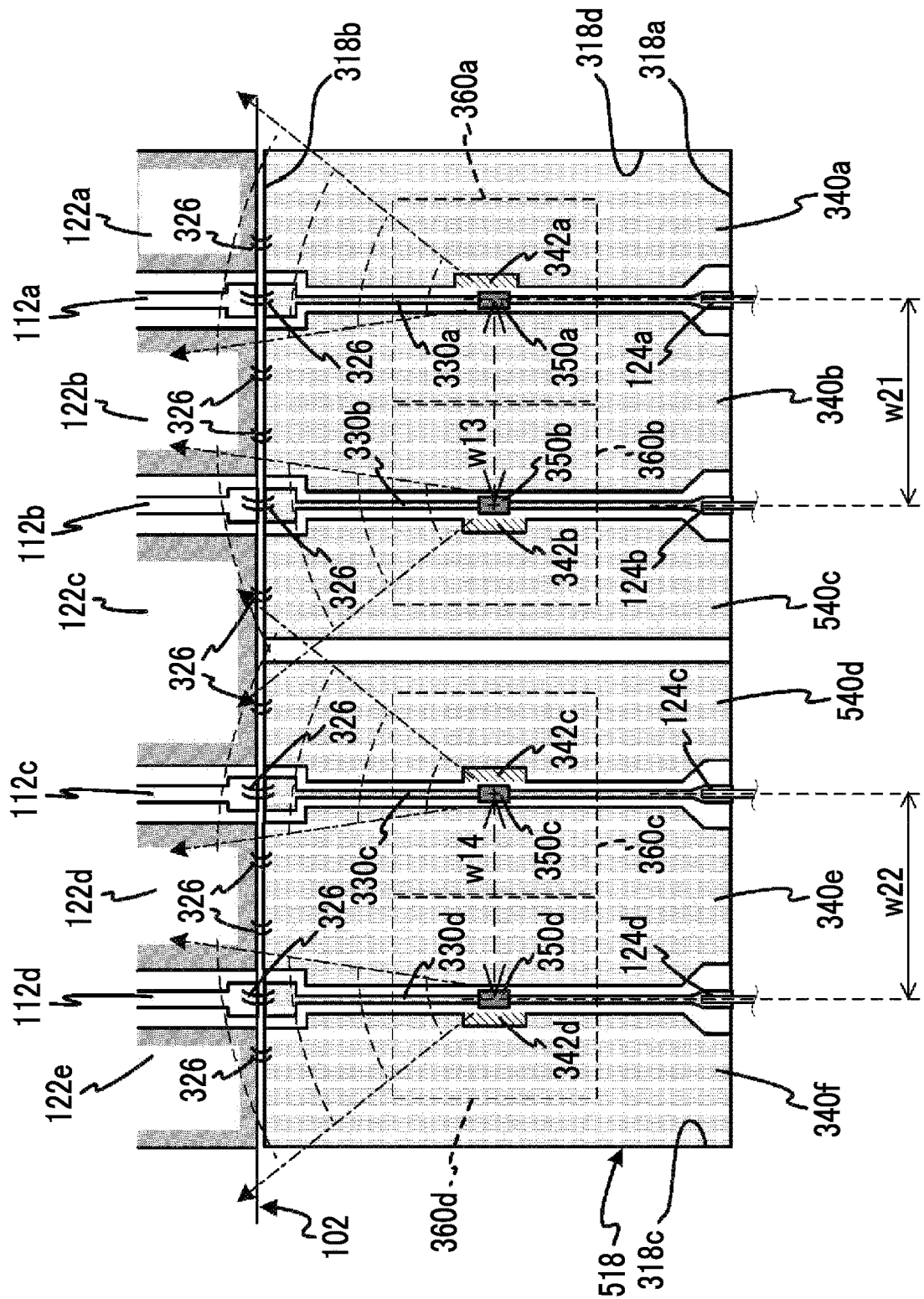
FIG. 5 is a diagram illustrating a configuration of a relay substrate according to a first modification example of the optical modulator according to the first embodiment.

FIG. 5 is a diagram illustrating a configuration of a relay substrate 518 according to a first modification example, and is a diagram corresponding to the partial detailed view of the first embodiment illustrated in FIG. 3. The relay substrate 518 can be used instead of the relay substrate 118 in the optical modulator 100 illustrated in FIG. 1. In FIG. 5, the same reference numerals as those in FIG. 3 are used for the same components as those of the components of the relay substrate 118 illustrated in FIG. 3, and the above description of FIG. 3 will be incorporated herein.

The relay substrate 518 has the same configuration as the relay substrate 118, but also in the component mounting areas 360b and 360c for the component mounting portions 350b and 350c of the signal conductor patterns 330b and 330c, two ground conductor patterns sandwiching the signal conductor patterns 330b and 330c, respectively, are configured asymmetrically with respect to a straight line extending in the extending direction of the signal conductor patterns 330b and 330c in the component mounting portions 350b and 350c.

Here, similar to the component mounting area 360a, the component mounting area 360b is defined as an area having a square shape in the plan view in which a direction of a side of the component mounting area having the square shape is same as the extending direction of the at least one signal conductor pattern 330b in the component mounting portion 350b and a length of a side of the component mounting area is equal to a distance (pitch) W13 from the center of the component mounting portion 350b to a portion on the adjacent signal conductor pattern 330a closest to the center thereof (for example, the center in a width direction of the signal conductor pattern 330a in the portion). In the present embodiment, since the signal conductor pattern 330 is formed parallel to the side edge 318d and linearly, a length w13 of one side of the component mounting area 360b is equal to the distance (pitch) w21 between the center line in the width direction of the signal conductor pattern 330b and the center line in the width direction of the signal conductor pattern 330a. That is, w13=w21.

Further, similar to the component mounting area 360d, the component mounting area 360c is defined as an area having a square shape in the plan view in which a direction of a side of the component mounting area having the square shape is same as the extending direction of the at least one signal conductor pattern 330c in the component mounting portion 350c and a length of a side of the component mounting area is equal to a distance (pitch) W14 from the center of the component mounting portion 350c to a portion on the adjacent signal conductor pattern 330d closest to the center thereof (for example, the center in a width direction of the signal conductor pattern 330d in the portion). In the present embodiment, since the signal conductor pattern 330 is formed parallel to the side edge 318d and linearly, a length w14 of one side of the component mounting area 360c is equal to the distance (pitch) w22 between a center line in the width direction of the signal conductor pattern 330c and a center line in the width direction of the signal conductor pattern 330d. That is, w14=w22.

More specifically, the relay substrate 518 has the same configuration as the relay substrate 118, but is different from the relay substrate 118 in that it includes ground conductor patterns 540c and 540d instead of the ground conductor patterns 340c and 340d. The ground conductor pattern 540c has the same configuration as the ground conductor pattern 340c, but is different from the ground conductor pattern 340c in that it has a notched portion 342b (hatched portion illustrated in FIG. 5) within the component mounting area 360b. Thus, the ground conductor patterns 340b and 540c are formed to have portions in which the separation distances (gaps) from the respective edges of the ground conductor patterns 340b and 540c to the opposite edges of the signal conductor pattern 330b are different from each other in the component mounting area 360b.

Therefore, similar to the component mounting portion 350a, the leaked microwave generated from the component mounting portion 350b has a higher intensity than the other directions, toward the ground conductor pattern 540c in which the confinement of high-frequency signals is weakened by the presence of the notched portion 342b, for example, in FIG. 5, in a direction area sandwiched by arrows of two alternate long and short dash lines extending from the component mounting portion 350b. As a result, crosstalk from the signal conductor pattern 330b to the signal conductor pattern 330a due to the leaked microwave generated from the component mounting portion 350b is reduced.

Therefore, in the relay substrate 518, crosstalk between the signal conductor patterns 330a and 330b respectively propagating the two high-frequency electrical signals forming one pair is effectively suppressed.

Similarly, the ground conductor pattern 540d has the same configuration as the ground conductor pattern 340d, but is different from the ground conductor pattern 340d in that it has a notched portion 342c (hatched portion illustrated in FIG. 5) within the component mounting area 360c. Thus, the ground conductor patterns 540d and 340e are formed to have portions in which the separation distances (gaps) from the respective edges of the ground conductor patterns 540d and 340e to the opposite edges of the signal conductor pattern 330c are different from each other in the component mounting area 360c.

As a result, the leaked microwave generated from the component mounting portion 350c has a higher intensity than the other directions, in the direction of the ground conductor pattern 540d in which the confinement of high-frequency signals is weakened by the presence of the notched portion 342c, for example, in FIG. 5, in a direction area sandwiched by arrows of two alternate long and short dash lines extending from the component mounting portion 350c. As a result, crosstalk from the signal conductor pattern 330c to the signal conductor pattern 330d due to the leaked microwave generated from the component mounting portion 350c is reduced.

Therefore, in the relay substrate 518, crosstalk between the signal conductor patterns 330c and 330d, which respectively propagate two high-frequency electrical signals forming the other pair, is effectively suppressed.

As a result, the relay substrate 518 can realize further appropriate optical modulation characteristics than the case where the relay substrate 118 is used.

In the first embodiment and the first modification example, it is assumed that the signal conductor pattern 330 is formed in a linear shape, but the present invention is not limited thereto. Similarly, in the other modification examples and embodiments illustrated below, the signal conductor pattern 330 can be configured in any shape including curves and bends depending on the required electrical characteristics, the arrangement of the signal input terminals 124, and/or the arrangement of the signal electrodes 112 of the optical modulation element 102, and the like.

Here, in an optical modulator having an optical modulation element using an LN substrate, the external dimensions of the relay substrate are typically, for example, several mm×ten and several mm. In a relay substrate of this size, the length of one side of the component mounting area 360 having a square shape in a plan view, is, for example, about several hundred μm, and the signal conductor pattern 330 can generally be regarded as a straight line within the component mounting area.

Second Modification Example

Figure 6:
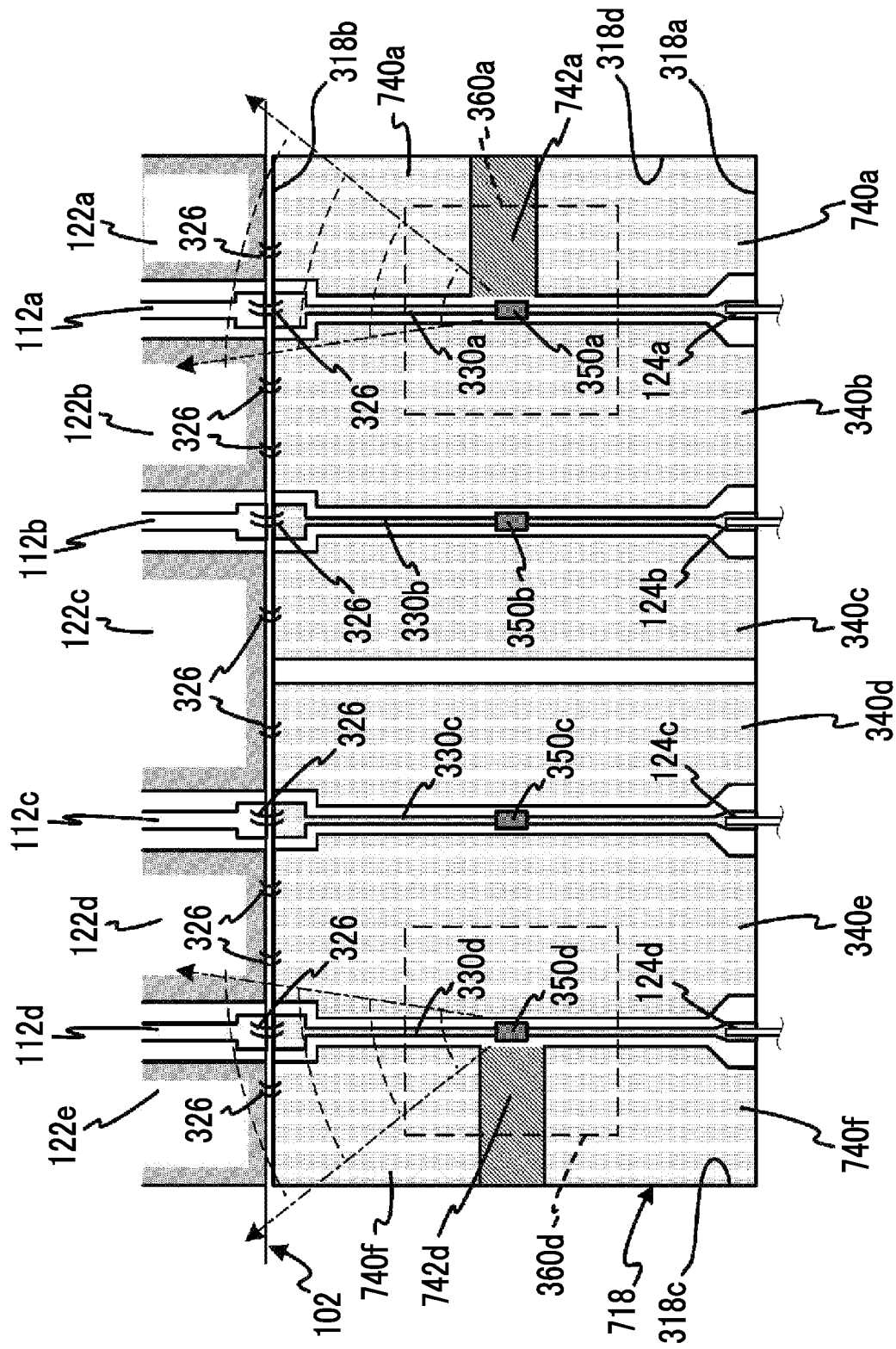
FIG. 6 is a diagram illustrating a configuration of a relay substrate according to a second modification example of the optical modulator according to the first embodiment.

FIG. 6 is a diagram illustrating a configuration of a relay substrate 718 according to a second modification example, and is a diagram corresponding to the partial detailed view of the first embodiment illustrated in FIG. 3. The relay substrate 718 can be used instead of the relay substrate 118 in the optical modulator 100 illustrated in FIG. 1. In FIG. 6, the same reference numerals as those in FIG. 3 are used for the same components as those of the components of the relay substrate 118 illustrated in FIG. 3, and the above description of FIG. 3 will be incorporated herein.

The relay substrate 718 has the signal conductor pattern 330 formed at the same position as the relay substrate 118, and each of these signal conductor patterns 330 includes the component mounting portion 350, in the same manner as the relay substrate 118. Therefore, in the relay substrate 718, the component mounting areas 360a and 360d are defined for each of the component mounting portions 350 of the signal conductor patterns 330, in the same manner as the relay substrate 118.

The relay substrate 718 has the same configuration as the relay substrate 118, but is different from the relay substrate 118 in that it includes ground conductor patterns 740a and 740f instead of the ground conductor patterns 340a and 340f. The ground conductor pattern 740a has the same configuration as the ground conductor pattern 340a of the relay substrate 118 illustrated in FIG. 3, but is different from the ground conductor pattern 340a in that it has a discontinuous section 742a (that is, no conductor is provided) in the component mounting area 360a.

Therefore, in the relay substrate 718, the effect of confining the high-frequency signal on the side of the ground conductor pattern 740a of the signal conductor pattern 330a in the component mounting area 360a is weaker than that in the case of using the ground conductor pattern 340a. Therefore, the leaked microwaves generated in the component mounting area 360a are more likely to be unevenly distributed on the side of the ground conductor pattern 740a as compared with the relay substrate 118 illustrated in FIG. 3. As a result, in the relay substrate 718, the crosstalk from the signal conductor pattern 330a to the signal conductor pattern 330b due to the leaked microwave is further reduced as compared with the relay substrate 118.

Similarly, the ground conductor pattern 740f has the same configuration as the ground conductor pattern 340f of the relay substrate 118 illustrated in FIG. 3, but is different from the ground conductor pattern 340f in that it has a discontinuous section 742d in the component mounting area 360d. Therefore, the leaked microwaves generated in the component mounting area 360d are more likely to be unevenly distributed on the side of the ground conductor pattern 740f as compared with the relay substrate 118 illustrated in FIG. 3. As a result, in the relay substrate 718, the crosstalk from the signal conductor pattern 330d to the signal conductor pattern 330c due to the leaked microwave is further reduced as compared with the relay substrate 118.

In particular, the configuration in which the discontinuous sections 742a and 742d are provided in the ground conductor patterns 740a and 740f as illustrated in FIG. 6 can greatly weaken the ground intensities of the ground conductor patterns 740a and 740f with respect to the ground conductor patterns 340b and 340e as compared with the configuration in which the notched portions 342a and 342d are provided as illustrated in FIG. 3 (that is, the impedance of the ground conductor patterns 740a and 740f with respect to the ground line can be made higher than the impedance of the ground conductor patterns 340b and 340e with respect to the ground line). Therefore, the relay substrate 718 of the present modification example has an effective configuration when it is desired to bias the propagation direction of the leaked microwave generated from the component mounting portion 350 while keeping the length of the asymmetrical portion of the two ground conductor patterns 340 in the component mounting area 360 as short as possible.

Third Modification Example

Figure 7:
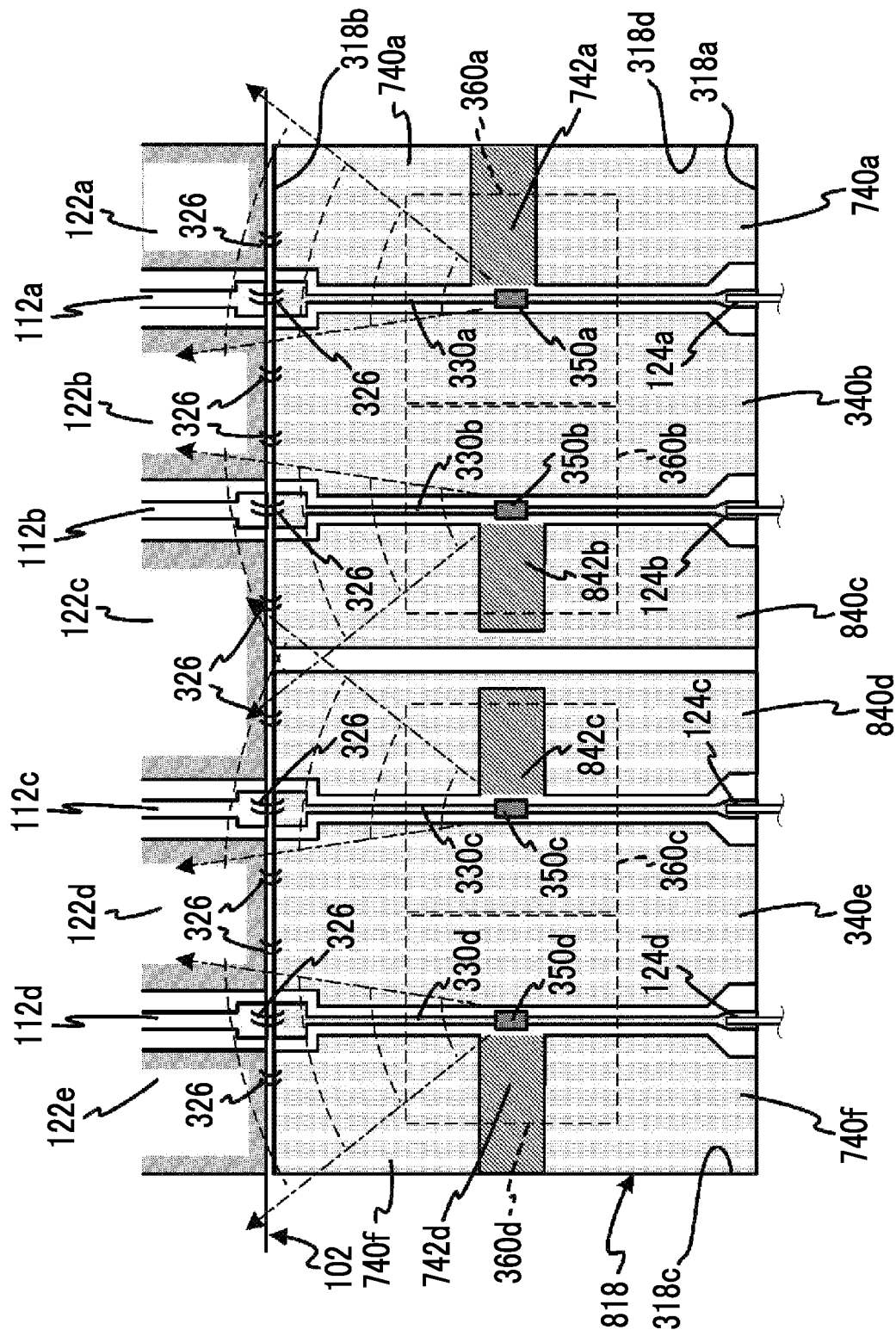
FIG. 7 is a diagram illustrating a configuration of a relay substrate according to a third modification example of the optical modulator according to the first embodiment.

FIG. 7 is a diagram illustrating a configuration of a relay substrate 818 according to a third modification example, and is a diagram corresponding to the partial detailed view of the first embodiment illustrated in FIG. 3. The relay substrate 818 can be used instead of the relay substrate 118 in the optical modulator 100 illustrated in FIG. 1. In FIG. 7, the same reference numerals as those in FIGS. 3, 5, and 6 are used for the same components as those of the components of the relay substrates 118, 518, and 718 illustrated in FIGS. 3, 5, and 6, and the above descriptions of FIGS. 3, 5, and 6 will be incorporated herein.

The relay substrate 818 has the same configuration as the relay substrate 518 of the first modification example illustrated in FIG. 5, but includes ground conductor patterns 740a and 740f similar to the relay substrate 718 of the second modification example illustrated in FIG. 6 instead of the ground conductor patterns 340a and 340f, and includes ground conductor patterns 840c and 840d instead of the ground conductor patterns 540c and 540d.

The ground conductor patterns 840c and 840d have the same configurations as the ground conductor patterns 540c and 540d of the relay substrate 518 illustrated in FIG. 5, but are different from the ground conductor patterns 540c and 540d in that they have discontinuous sections 842b and 842c in the component mounting areas 360b and 360c.

Since the relay substrate 818 having the above configuration includes the ground conductor patterns 740a and 740f, similar to the relay substrate 718 of the second modification example illustrated in FIG. 6, the crosstalk from the signal conductor pattern 330a to the signal conductor pattern 330b and the crosstalk from the signal conductor pattern 330d to the signal conductor pattern 330c are further reduced as compared with the relay substrate 118 illustrated in FIG. 3.

Further, since the relay substrate 818 has the sections 842b and 842c in which conductors are not formed in the ground conductor patterns 840c and 840d, respectively, the leaked microwaves generated in the component mounting areas 360b and 360c are more likely to be unevenly distributed on the sides of the ground conductor patterns 840c and 840d as compared with the relay substrate 518 illustrated in FIG. 5. As a result, in the relay substrate 818, the crosstalk from the signal conductor pattern 330b to the signal conductor pattern 330a and from the signal conductor pattern 330c to the signal conductor pattern 330d due to the leaked microwaves is further reduced as compared with the relay substrate 518.

Fourth Modification Example

Figure 8:
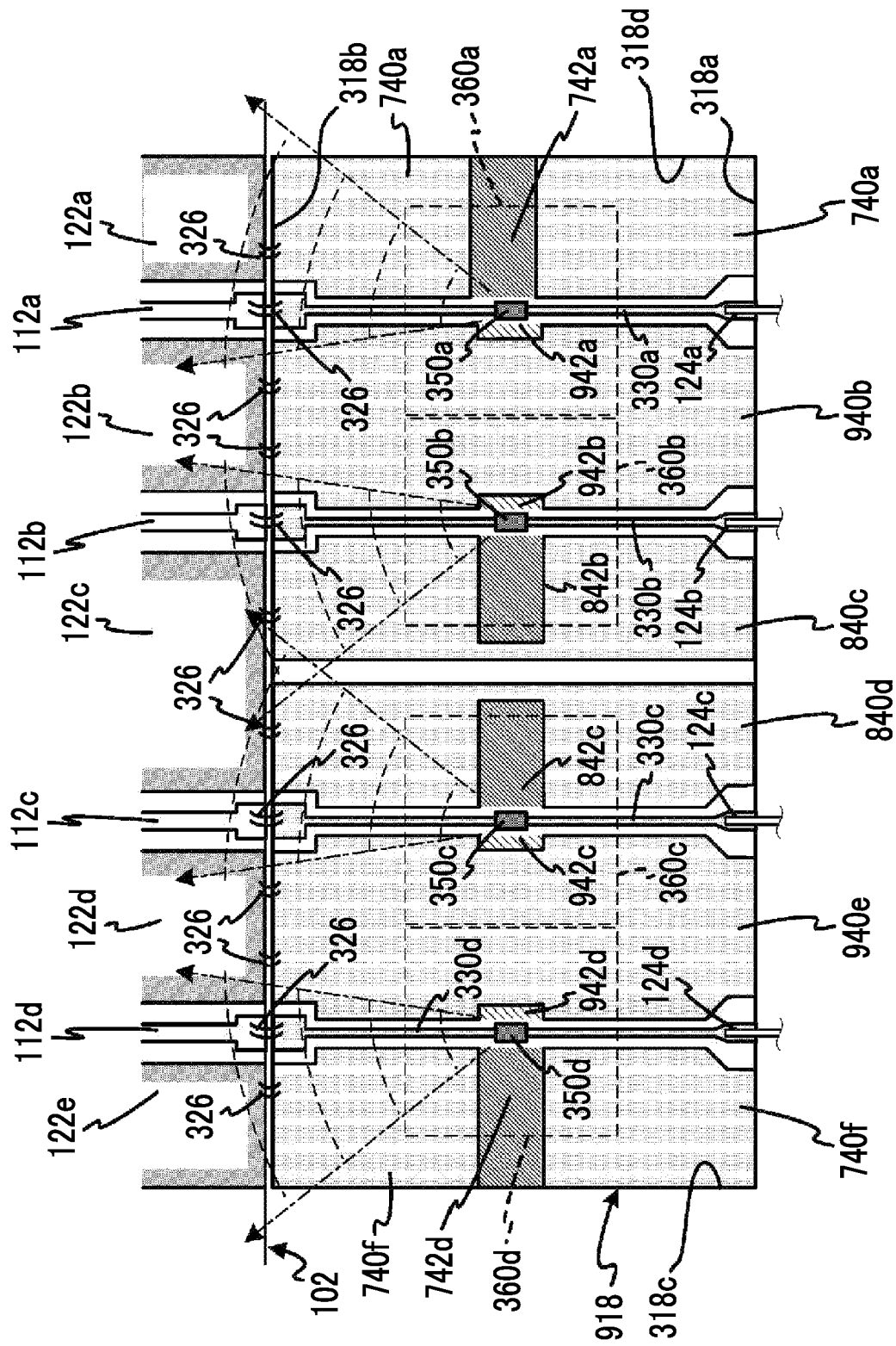
FIG. 8 is a diagram illustrating a configuration of a relay substrate according to a fourth modification example of the optical modulator according to the first embodiment.

FIG. 8 is a diagram illustrating a configuration of a relay substrate 918 according to a fourth modification example, and is a diagram corresponding to the partial detailed view of the first embodiment illustrated in FIG. 3. The relay substrate 918 can be used instead of the relay substrate 118 in the optical modulator 100 illustrated in FIG. 1, similar to the relay substrate 818 of the third modification example illustrated in FIG. 7. In FIG. 8, the same reference numerals as those in FIGS. 3 and 7 are used for the same components as those of the components of the relay substrates 118 and 818 illustrated in FIGS. 3 and 7, and the above descriptions of FIGS. 3 and 7 will be incorporated herein.

The relay substrate 918 has the same configuration as the relay substrate 818 of the third modification example illustrated in FIG. 7, and similar to the relay substrate 818, crosstalk between the signal conductor patterns 330a and 330b and between the signal conductor patterns 330c and 330d due to leaked microwaves is further reduced as compared with the relay substrate 518 of the first modification example illustrated in FIG. 5.

As described above, the relay substrate 918 has the same configuration as the relay substrate 818 of the third modification example illustrated in FIG. 7, but is different from the relay substrate 818 of the third modification example illustrated in FIG. 7 in that it includes ground conductor patterns 940b and 940e instead of the ground conductor patterns 340b and 340e. The ground conductor pattern 940b has the same configuration as the ground conductor pattern 340b of the relay substrate 818 of the third modification example illustrated in FIG. 7, but is different from the ground conductor pattern 340b in that recess portions 942a and 942b are provided on the edges facing the component mounting portions 350a and 350b, respectively, in the component mounting areas 360a and 360b.

That is, in the relay substrate 918, the other ground conductor pattern 940b facing the one ground conductor pattern 740a having the section 742a in which the conductor is not provided has a recess portion 942a in which a separation distance to a portion of the signal conductor pattern 330a constituting the component mounting portion 350a is formed longer than a separation distance to other portions of the signal conductor pattern 330a within the corresponding component mounting area 360a.

Normally, when the electrical circuit element is mounted on the signal conductor pattern 330a in the component mounting portion 350a, the mounting position of the electrical circuit element may change due to manufacturing variation or the like. For example, in the relay substrate 818 illustrated in FIG. 7, when such a displacement in the mounting position occurs in the direction of the ground conductor pattern 340b, which has a narrower separation distance from the signal conductor pattern 330a than the ground conductor pattern 740a, the characteristic impedance of the signal conductor pattern 330a can be changed.

Since the relay substrate 918 includes the ground conductor pattern 940b having the recess portion 942a instead of the ground conductor pattern 340b, even if the mounting position of the electrical circuit element in the component mounting portion 350a shifts to the ground conductor pattern 940b side, the ratio of the displacement amount of the mounting position to the separation distance between the component mounting portion 350a and the ground conductor pattern 940b is smaller than that of the relay substrate 818 having no recess portion 942a.

Therefore, in the relay substrate 918, the fluctuation of the characteristic impedance of the signal conductor pattern 330a due to the displacement of the mounting position can be alleviated (made smaller) as compared with the relay substrate 818 in the component mounting area 360a.

Similarly, in the relay substrate 918, the other ground conductor pattern 940b facing the one ground conductor pattern 840c having the section 842b in which the conductor is not provided has a recess portion 942b in which a separation distance to a portion of the signal conductor pattern 330b constituting the component mounting portion 350b is formed longer than a separation distance to other portions of the signal conductor pattern 330b within the corresponding component mounting area 360b. Therefore, in the relay substrate 918, the fluctuation of the characteristic impedance of the signal conductor pattern 330b due to the displacement of the mounting position of the electrical circuit element in the component mounting portion 350b can be alleviated (made smaller) as compared with the relay substrate 818 in the component mounting area 360b.

Similarly, the ground conductor pattern 940e of the relay substrate 918 has the same configuration as the ground conductor pattern 340e of the relay substrate 818 of the third modification example illustrated in FIG. 7, but is different from the ground conductor pattern 340e in that recess portions 942c and 942d are provided on the edges facing the signal conductor patterns 330c and 330d, respectively, in the component mounting areas 360c and 360d.

That is, in the relay substrate 918, the other ground conductor pattern 940e facing the one ground conductor pattern 840d having the section 842c in which the conductor is not provided has a recess portion 942c in which a separation distance to a portion of the signal conductor pattern 330c constituting the component mounting portion 350c is formed longer than a separation distance to other portions of the signal conductor pattern 330c within the corresponding component mounting area 360c. Further, in the relay substrate 918, the other ground conductor pattern 940e facing the one ground conductor pattern 740f having the section 742d in which the conductor is not provided has a recess portion 942d in which a separation distance to a portion of the signal conductor pattern 330d constituting the component mounting portion 350d is formed longer than a separation distance to other portions of the signal conductor pattern 330d within the corresponding component mounting area 360d.

Thus, in the relay substrate 918, the fluctuation of the characteristic impedance of the signal conductor patterns 330c and 330d due to the displacement of the mounting positions of the electrical circuit elements in the component mounting portions 350c and 350d can be alleviated (made smaller) as compared with the relay substrate 818, respectively, in the component mounting areas 360c and 360d.

In FIG. 8, it is assumed that the recess portions 942a, 942b, 942c, and 942d (hereinafter, collectively also referred to as a recess portion 942) are configured to be longer than the length of the component mounting portion 350 along the extending direction of the corresponding signal conductor pattern 330, but the present invention is not limited thereto. The recess portion 942 may be configured to be shorter than the length of the component mounting portion 350 along the extending direction of the corresponding signal conductor pattern 330.

Fifth Modification Example

Figure 9:
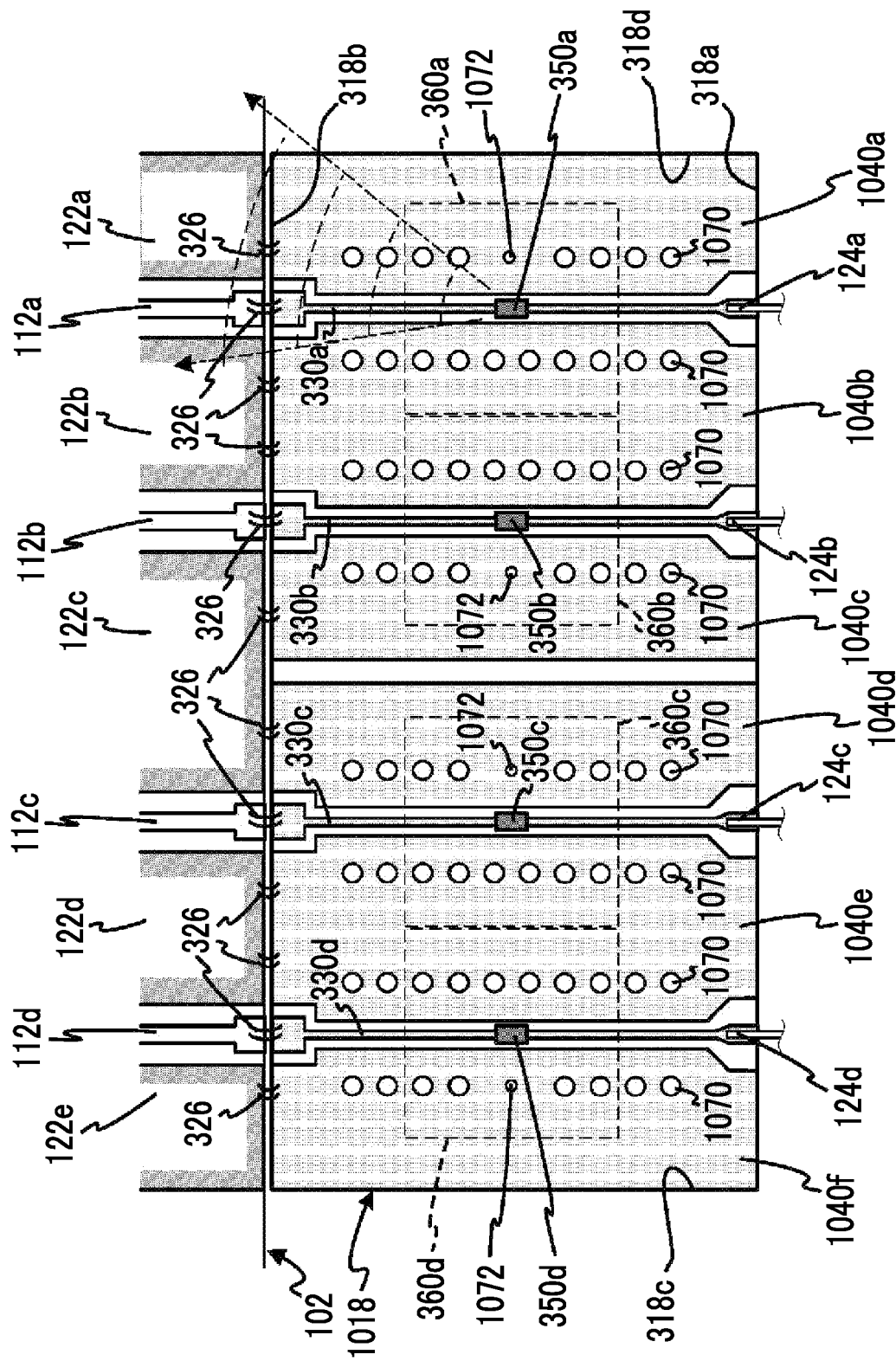
FIG. 9 is a diagram illustrating a configuration of a relay substrate according to a fifth modification example of the optical modulator according to the first embodiment.

FIG. 9 is a diagram illustrating a configuration of a relay substrate 1018 according to a fifth modification example, and is a diagram corresponding to the partial detailed view of the first embodiment illustrated in FIG. 3. The relay substrate 1018 can be used instead of the relay substrate 118 in the optical modulator 100 illustrated in FIG. 3. In FIG. 9, the same reference numerals as those in FIG. 3 are used for the same components as those of the components of the relay substrate 118 illustrated in FIG. 3, and the above description of FIG. 3 will be incorporated herein.

The relay substrate 1018 has the signal conductor pattern 330 formed at the same position as the relay substrate 118 of the first embodiment illustrated in FIG. 3, and similar to the relay substrate 118, each signal conductor pattern 330 is provided with the component mounting portion 350. Therefore, in the relay substrate 1018, the component mounting area 360 is defined for each of the component mounting portions 350, in the same manner as the relay substrate 118.

In the relay substrates 118, 518, 818, and 918 illustrated in FIGS. 3, 5, 6, and 7 according to the first embodiment and the first to fourth modification examples described above, in the component mounting area 360, two ground conductor patterns 1040 sandwiching the signal conductor pattern 330 are configured to have contour shapes that are asymmetrical to each other. On the other hand, in the relay substrate 1018 according to the present modification example, in the component mounting area 360, the two ground conductor patterns sandwiching the signal conductor pattern 330 are configured to be asymmetrical with respect to the mode of forming vias by setting diameters and the numbers of the vias provided in the two ground conductor patterns to be different from each other.

Specifically, the relay substrate 1018 of the present modification example has the same configuration as the relay substrate 118 illustrated in FIG. 3, but is different from the relay substrate 118 in that it includes ground conductor patterns 1040a, 1040b, 1040c, 1040d, 1040e, and 1040f (collectively also referred to as a ground conductor pattern 1040) instead of the ground conductor patterns 340a, 340b, 340c, 340d, 340e, and 340f.

The ground conductor patterns 1040a, 1040b, 1040c, 1040d, 1040e, and 1040f have the same configurations as the ground conductor patterns 340a, 340b, 340c, 340d, 340e, and 340f, respectively.

However, unlike the ground conductor patterns 340a and 340f of the relay substrate 118 illustrated in FIG. 3, the ground conductor pattern 1040a and 1040f do not have notched portions 342a and 342d. Further, the ground conductor patterns 1040a, 1040b, 1040c, 1040d, 1040e, and 1040f each have a plurality of vias 1070 having the same diameter, for example. In FIG. 9, although the reference numeral 1070 is attached to only one via for each of the ground conductor patterns 1040 in order to avoid redundant description, it should be understood that the other circles having the same diameter as the circle to which the reference numeral 1070 is attached are also the vias 1070.

In particular, in the relay substrate 1018, the two ground conductor patterns 1040 sandwiching the signal conductor pattern 330 are configured such that the diameters and numbers of vias provided in the ground conductor pattern differ from each other in the component mounting area 360. Specifically, in the component mounting area 360a, the ground conductor pattern 1040b is provided with six vias 1070, whereas the ground conductor pattern 1040a is provided with four vias 1070 and one via 1072 having a diameter smaller than that of the via 1070.

In general, in a high-frequency signal line including a signal conductor and a ground conductor, the smaller the impedance from the ground conductor to a ground line (that is, the more so-called ground strengthening is sufficient), the stronger confinement of the high-frequency signal in the signal conductor.

In the component mounting area 360a of the relay substrate 1018, since the vias are provided in the ground conductor patterns 1040a and 1040b with the above configuration, the impedance of the ground conductor pattern 1040a with respect to the rear surface ground conductor (not illustrated) constituting the ground line provided on the back surface of the relay substrate 1018 is higher than the impedance of the ground conductor pattern 1040b with respect to the rear surface ground conductor. That is, in the component mounting area 360a, the high-frequency confinement effect of the signal conductor pattern 330a is lower on the side of the ground conductor pattern 1040a than on the side of the ground conductor pattern 1040b.

Therefore, the leaked microwave generated in the component mounting portion 350a is biased in the direction of the ground conductor pattern 1040a (for example, in FIG. 9, in a direction area sandwiched by arrows of two alternate long and short dash lines extending from the component mounting portion 350a) and propagate to have a higher intensity than the other directions.

As a result, the intensity of the leaked microwave in a direction area other than the direction area sandwiched by the arrows of the alternate long and short dash lines is relatively reduced, and crosstalk from the signal conductor pattern 330a to the signal conductor pattern 330b due to the leaked microwave generated from the component mounting portion 350a is reduced.

Similarly, in the component mounting area 360b of the relay substrate 1018, the ground conductor pattern 1040b is provided with six vias 1070, whereas the ground conductor pattern 1040c is provided with four vias 1070 and one via 1072 having a diameter smaller than that of the via 1070. Therefore, similar to the above, the impedance of the ground conductor pattern 1040c with respect to the rear surface ground conductor is higher than the impedance of the ground conductor pattern 1040b with respect to the rear surface ground conductor, and crosstalk from the signal conductor pattern 330b to the signal conductor pattern 330a due to the leaked microwave generated from the component mounting portion 350b is reduced.

Further, the same applies to the component mounting areas 360c and 360d. That is, in the component mounting areas 360c and 360d, corresponding portions on the ground conductor pattern 1040d are provided with six vias 1070, respectively, whereas the ground conductor patterns 1040d and 1040f are provided with four vias 1070 and one via 1072 having a diameter smaller than that of the via 1070.

Therefore, the leaked microwaves generated in the component mounting portions 350c and 350d are unevenly distributed in the directions of the ground conductor patterns 1040d and 1040f, respectively. As a result, the crosstalk from the signal conductor pattern 330c to the signal conductor pattern 330d, from the signal conductor pattern 330d to the signal conductor pattern 330c, and from the signal conductor pattern 330d to the signal conductor pattern 330c due to the leaked microwaves is reduced.

In the present modification example, the two ground conductor patterns sandwiching the signal conductor pattern have been described as having different diameters and numbers of vias, but the present invention is not limited thereto. For example, the diameters of the vias are the same in the two ground conductor patterns but only the numbers may be different from each other, or the numbers of the vias are the same in the two ground conductor patterns but the diameters of at least some vias may be different from the diameters of other vias.

Sixth Modification Example

Figure 10:
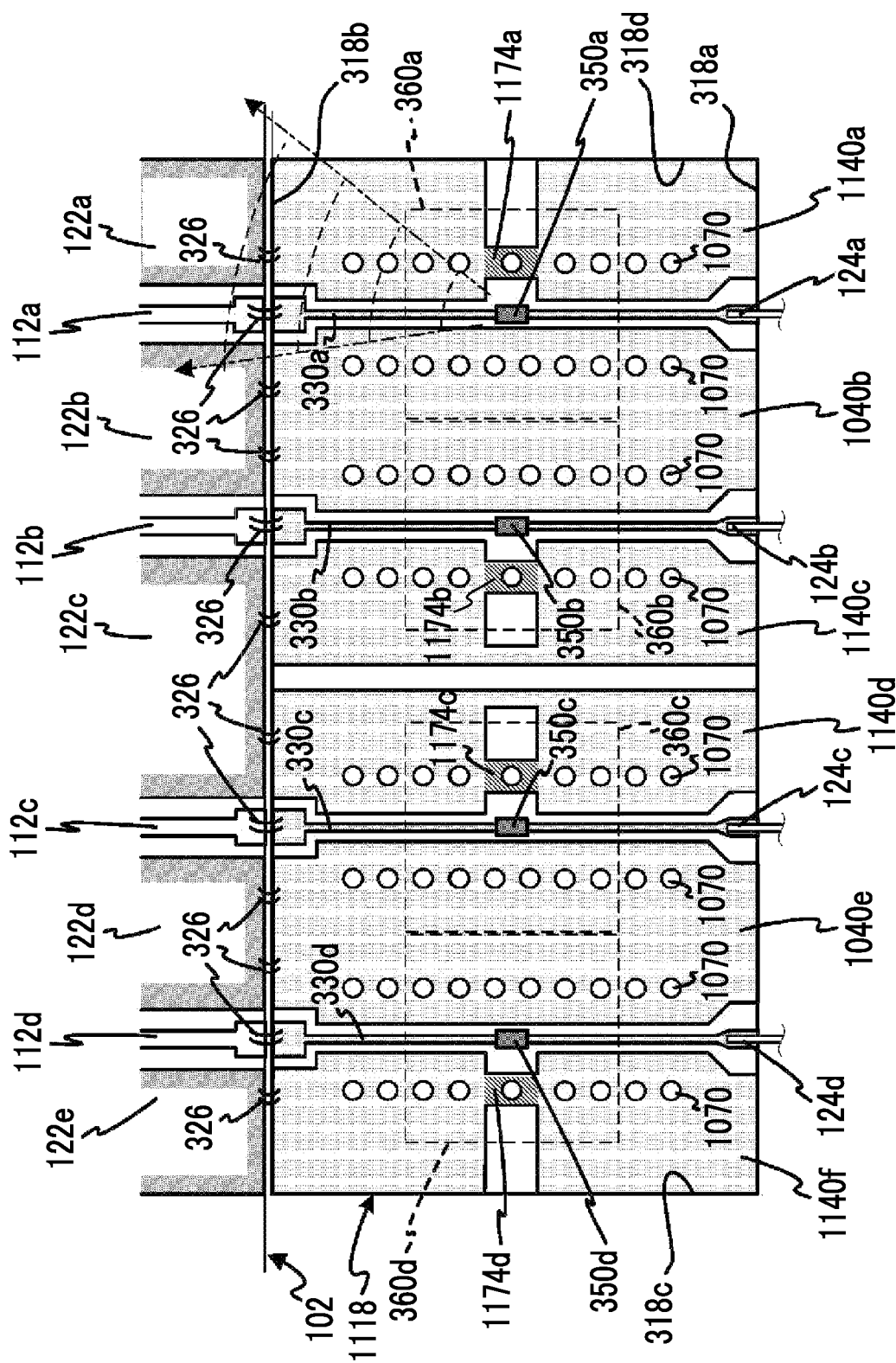
FIG. 10 is a diagram illustrating a configuration of a relay substrate according to a sixth modification example of the optical modulator according to the first embodiment.

FIG. 10 is a diagram illustrating a configuration of a relay substrate 1118 according to a sixth modification example, and is a diagram corresponding to the partial detailed view of the first embodiment illustrated in FIG. 3. The relay substrate 1118 can be used instead of the relay substrate 118 in the optical modulator 100 illustrated in FIG. 1. In FIG. 10, the same reference numerals as those in FIGS. 3 and 9 are used for the same components as those of the components of the relay substrates 118 and 1080 illustrated in FIGS. 3 and 9, and the above descriptions of FIGS. 3 and 9 will be incorporated herein.

In the relay substrate 1118, different numbers of vias are provided in the two ground conductor patterns sandwiching the signal conductor pattern 330 in the component mounting area 360. Further, the two ground conductor patterns are formed to include portions whose widths measured in a direction orthogonal to the extending direction of the signal conductor pattern 330 are different from each other in the component mounting area 360.

Specifically, the relay substrate 1118 has the same configuration as the relay substrate 1018 of the fifth modification example illustrated in FIG. 9, but is different from the relay substrate 1018 in that it includes ground conductor patterns 1140a, 1140c, 1140d, and 1140f instead of the ground conductor patterns 1040a, 1040c, 1040d, and 1040f.

The ground conductor pattern 1140a has the same configuration as the ground conductor pattern 1040a of the relay substrate 1018 of the fifth modification example illustrated in FIG. 9, but includes a via 1070 at the position of the via 1072 instead of the via 1072. That is, the relay substrate 1118 is provided with different numbers of vias 1070 having the same diameter on the ground conductor patterns 1140a and 1040b in the component mounting area 360a.

Further, the ground conductor pattern 1140a has a narrow portion 1174a (hatched portion illustrated in FIG. 10) in the component mounting area 360a. The narrow portion 1174a is formed such that the width measured in the direction orthogonal to the extending direction of the signal conductor pattern 330a is shorter than the width direction length of the portion of the ground conductor pattern 1040b extending within the component mounting area 360a.

Thus, in the relay substrate 1118, the ground conductor pattern 1140a includes the narrow portion 1174a as a portion having a higher impedance to the ground line (for example, the rear surface ground conductor) than the ground conductor pattern 1040b in the component mounting area 360a.

Therefore, in the component mounting area 360a, the effect of confining the high-frequency signal in the signal conductor pattern 330a is lower on the side of the ground conductor pattern 1140a having the narrow portion 1174a than on side of the ground conductor pattern 1040b.

Therefore, the leaked microwave generated in the component mounting portion 350a is biased in the direction of the ground conductor pattern 1140a (for example, in FIG. 10, in a direction area sandwiched by arrows of two alternate long and short dash lines extending from the component mounting portion 350a) and emitted to have a higher intensity than the other directions.

As a result, the intensity of the leaked microwave in a direction area other than the direction area sandwiched by the arrows of the alternate long and short dash lines is relatively reduced, and crosstalk from the signal conductor pattern 330a to the signal conductor pattern 330b due to the leaked microwave is reduced.

Similarly, the ground conductor pattern 1140c has a narrow portion 1174b (hatched portion illustrated in FIG. 10) in the component mounting area 360b. The narrow portion 1174b is formed such that the width measured in the direction orthogonal to the extending direction of the signal conductor pattern 330b is shorter than the width direction length of the portion of the ground conductor pattern 1040b extending within the component mounting area 360b.

Therefore, the leaked microwave generated in the component mounting portion 350b is unevenly emitted in the direction of the ground conductor pattern 1140c, and the crosstalk from the signal conductor pattern 330b to the signal conductor pattern 330a due to the leaked microwave is reduced.

Similarly, in the relay substrate 1118, the ground conductor patterns 1140d and 1140f each have a different number of vias 1070 from the ground conductor pattern 1040e in each of the component mounting areas 360c and 360d. Further, in the relay substrate 1118, the ground conductor patterns 1140*d* and 1140*f* have narrow portions 1174*c* and 1174*d*, respectively, in the component mounting areas 360*c* and 360*d*. The narrow portions 1174*c* and 1174*d* each are formed such that the widths measured in the direction orthogonal to the extending direction of the signal conductor patterns 330*c* and 330*d* are shorter than the width direction length of the portion of the ground conductor pattern 1040*c* extending within the component mounting areas 360*c* and 360*d*.

Therefore, the leaked microwaves generated in the component mounting portions 350*c* and 350*d* are unevenly distributed and propagate in the directions of the ground conductor patterns 1140*d* and 1140*f*, respectively. As a result, the crosstalk from the signal conductor pattern 330*b* to the signal conductor pattern 330*a*, from the signal conductor pattern 330*c* to the signal conductor pattern 330*d*, and from the signal conductor pattern 330*d* to the signal conductor pattern 330*c* due to the leaked microwaves is reduced.

In the relay substrate 1118 illustrated in FIG. 10, the narrow portion 1174*a* and the like are formed with a width wider than the diameter of the via 1070, but the present invention is not limited thereto. The narrow portion 1174*a* and the like may be formed with a width narrower than the diameter of the via 1070.

Seventh Modification Example

Figure 11:
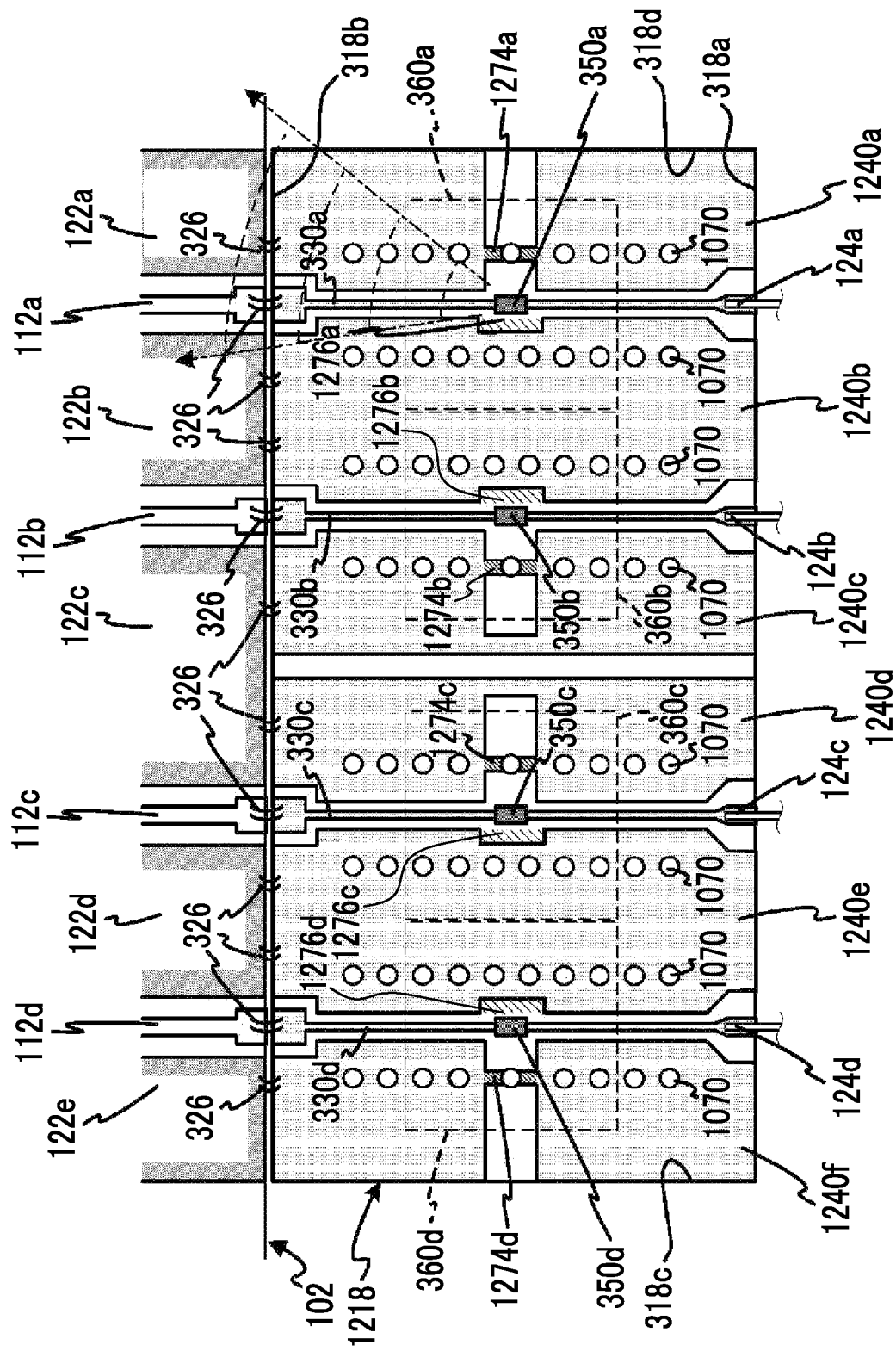
FIG. 11 is a diagram illustrating a configuration of a relay substrate according to a seventh modification example of the optical modulator according to the first embodiment.

FIG. 11 is a diagram illustrating a configuration of a relay substrate 1218 according to a seventh modification example, and is a diagram corresponding to the partial detailed view of the first embodiment illustrated in FIG. 3. The relay substrate 1218 can be used instead of the relay substrate 118 in the optical modulator 100 illustrated in FIG. 1, similar to the relay substrate 1118 of the sixth modification example illustrated in FIG. 10. In FIG. 11, the same reference numerals as those in FIG. 10 are used for the same components as those of the components of the relay substrate 1118 illustrated in FIG. 10, and the above description of FIG. 10 will be incorporated herein.

The relay substrate 1218 has the same configuration as the relay substrate 1118 of the sixth modification example illustrated in FIG. 10, but is different from the relay substrate 1118 in that it includes ground conductor patterns 1240*a*, 1240*b*, 1240*c*, 1240*d*, 1240*e*, and 1240*f* instead of the ground conductor patterns 1140*a*, 1040*b*, 1040*c*, 1140*d*, 1140*e*, and 1040*f*.

The ground conductor patterns 1240*a*, 1240*c*, 1240*d*, and 1240*f* have the same configurations as the ground conductor patterns 1140*a*, 1140*c*, 1140*d*, and 1140*f* of the relay substrate 1118 of the sixth modification example illustrated in FIG. 10, but are different from the relay substrate 1118 in that they include narrow portions 1274*a*, 1274*b*, 1274*c*, and 1274*d*, respectively, similar to the narrow portions 1174*a*, 1174*b*, 1174*c*, and 1174*d* of the sixth modification example illustrated in FIG. 10 and having a width narrower than the diameter of the via 1070 in the component mounting areas 360*a*, 360*b*, 360*c*, and 360*d*.

That is, the narrow portions 1274*a* and 1274*b* each are formed such that the widths measured in the direction orthogonal to the extending direction of the signal conductor patterns 330*a* and 330*b* are shorter than the width direction length of the portion of the ground conductor pattern 1240*b* extending within the component mounting areas 360*a* and 360*b* and are narrower than the diameter of the via 1070. Further, the narrow portions 1274*c* and 1274*d* each are formed such that the widths measured in the direction orthogonal to the extending direction of the signal conductor patterns 330*c* and 330*d* are shorter than the width direction length of the portion of the ground conductor pattern 1240*e* extending within the component mounting areas 360*c* and 360*d* and are narrower than the diameter of the via 1070.

Thus, the ground conductor patterns 1240*a*, 1240*c*, 1240*d*, and 1240*f* have narrow portions 1274*a*, 1274*b*, 1274*c*, and 1274*d* having higher impedances between the ground conductor patterns 1240*a*, 1240*c*, 1240*d*, and 1240*f* and the ground line than the narrow portions 1174*a*, 1174*b*, 1174*c*, and 1174*d* of the relay substrate 1118 of the sixth modification example illustrated in FIG. 10, and the crosstalk between the signal conductor patterns 330*a* and 330*b* and between the signal conductor patterns 330*c* and 330*d* due to the leaked microwaves is reduced.

Further, the ground conductor patterns 1240*b* and 1240*e* of the relay substrate 1218 have the same configurations as the ground conductor patterns 1040*b* and 1040*e* of the relay substrate 1118 of the sixth modification example illustrated in FIG. 10, but are different from the relay substrate 1118 of the sixth modification example illustrated in FIG. 10 in that they include recess portions 1276*a*, 1276*b*, 1276*c*, and 1276*d* (hereinafter, collectively also referred to as a recess portion 1276), respectively, similar to the recess portions 942*a*, 942*b*, 942*c*, and 942*d* of the relay substrate 914 of the fourth modification example illustrated in FIG. 8 in the component mounting areas 360*a*, 360*b*, 360*c*, and 360*d*.

That is, in the relay substrate 1218, the ground conductor pattern 1240*b* has recess portions 1276*a* and 1276*b* in which separation distances to portions of the signal conductor patterns 330*a* and 330*b* constituting the component mounting portions 350*a* and 350*b* are formed longer than separation distances to other portions of the signal conductor patterns 330*a* and 330*b* within the corresponding component mounting areas 360*a* and 360*b*. Further, the ground conductor pattern 1240*e* has recess portions 1276*d* and 1276*d* in which separation distances to portions of the signal conductor patterns 330*c* and 330*d* constituting the component mounting portions 350*c* and 350*d* are formed longer than separation distances to other portions of the signal conductor patterns 330*c* and 330*d* within the corresponding component mounting areas 360*c* and 360*d*.

As a result, in the relay substrate 1218, similar to the relay substrate 914 of the fourth modification example illustrated in FIG. 8, when the electrical circuit elements constituting the component mounting portions 350*a*, 350*b*, 350*c*, and 350*d* are mounted on the signal conductor patterns 330*a*, 330*b*, 330*c*, and 330*d*, even if the mounting position of the corresponding electrical circuit element shifts in the direction of the adjacent ground conductor patterns 1240*b* and 1240*e*, the fluctuation of the characteristic impedance of the signal conductor patterns 330*a*, 330*b*, 330*c*, and 330*d* due to the displacement of the mounting position can be alleviated as compared with the relay substrate 1118.

In addition, in FIGS. 10 and 11, it is assumed that vias are provided in the narrow portions 1174*a*, 1274, and the like but the present invention is not limited thereto. Even in a configuration in which vias are not provided in the narrow portions 1174*a*, 1274, and the like, the same effect as described above can be obtained.

Further, in the relay substrate 1218 of the present modification example and the relay substrate 1118 of the seventh modification example illustrated in FIG. 10, it is assumed that the two ground conductor patterns are formed to include portions having different numbers of vias from each other and having different widths measured in a direction orthogonal to the extending direction of the signal conductor pattern 330, in the component mounting area 360, but the present invention is not limited thereto. For example, the two ground conductor patterns are formed to include portions whose widths measured in a direction orthogonal to the extending direction of the signal conductor pattern 330 are different from each other in the component mounting area 360, but may have the same number of vias or no vias at all. Even with this configuration, the impedances of the two ground conductor patterns and the ground line may be different from each other, and the same effect as described above can be obtained.

Eighth Modification Example

Figure 12:
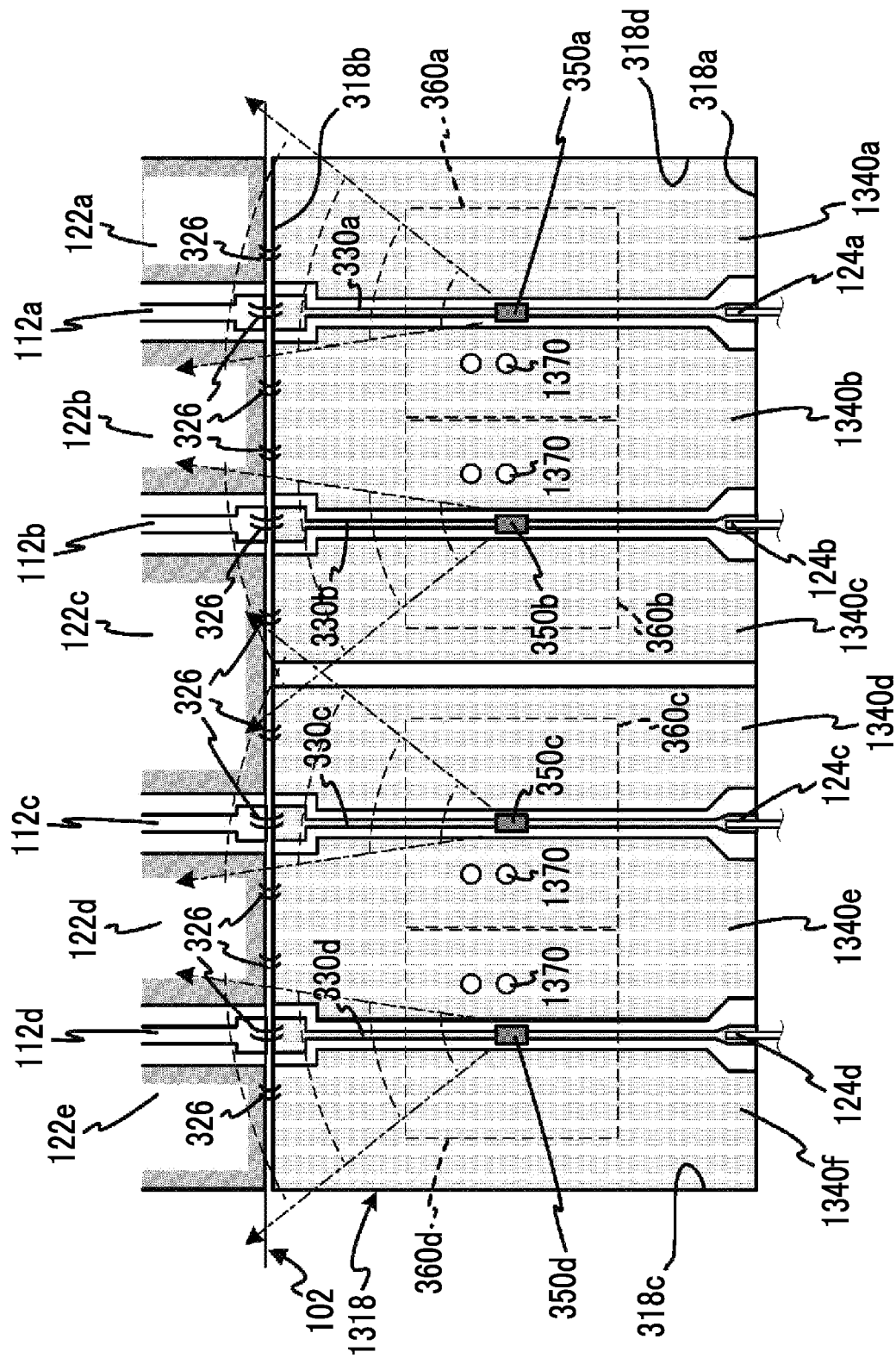
FIG. 12 is a diagram illustrating a configuration of a relay substrate according to an eighth modification example of the optical modulator according to the first embodiment.

FIG. 12 is a diagram illustrating a configuration of a relay substrate 1318 according to an eighth modification example, and is a diagram corresponding to the partial detailed view of the first embodiment illustrated in FIG. 3. The relay substrate 1318 can be used instead of the relay substrate 118 in the optical modulator 100 illustrated in FIG. 1. In FIG. 12, the same reference numerals as those in FIG. 3 are used for the same components as those of the components of the relay substrate 118 illustrated in FIG. 3, and the above description of FIG. 3 will be incorporated herein.

The relay substrate 1318 has the same configuration as the relay substrate 118 illustrated in FIG. 3, but is different from the relay substrate 118 in that it includes ground conductor patterns 1340a, 1340b, 1340c, 1340d, 1340e, and 1340f instead of the ground conductor patterns 340a, 340b, 340c, 340d, 340e, and 340f.

The ground conductor patterns 1340a and 1340f have the same configurations as the ground conductor patterns 340a and 340f of the relay substrate 118 illustrated in FIG. 3, but are different from the relay substrate 118 in that they do not have the notched portions 342a and 342d. Further, in the present modification example, the ground conductor patterns 1340a, 1340c, 1340d, and 1340f do not have vias in the component mounting areas 360a, 360b, 360c, and 360d. However, these ground conductor patterns 1340a, 1340c, 1340d, and 1340f may have vias (not illustrated) outside the component mounting areas 360a, 360b, 360c, and 360d.

The ground conductor patterns 1340b, 1340e each have two vias 1370 in the component mounting areas 360a, 360b, 360c, 360d. Here, each of the ground conductor patterns 1340b and 1340e may have vias (not illustrated) outside the component mounting areas 360a, 360b, 360c, and 360d.

That is, in the relay substrate 1318, the vias 1370 are present only in the ground conductor patterns 1340b and 1340e, respectively, and vias are not present in the ground conductor patterns 1340a, 1340c, 1340d, and 1340f, in the component mounting areas 360a, 360b, 360c, and 360d.

Thus, in the relay substrate 1318, the impedance between each of the ground conductor patterns 1340b and 1340e and the ground line in the component mounting areas 360a, 360b, 360c and 360d is lower than that of the ground conductor patterns 1340a, 1340c, 1340d, and 1340f.

Therefore, in the relay substrate 1318, in the component mounting areas 360a, 360b, 360c, and 360d, the effect of confining the high-frequency signals in the signal conductor pattern 330a, 330b, 330c, and 330d is relatively lower on the side of the ground conductor patterns 1340a, 1340c, 1340d, and 1340f than on the side of the ground conductor patterns 1340b and 1340e.

As a result, the leaked microwaves generated in the component mounting portions 350a, 350b, 350c, and 350d are emitted unevenly in the directions of the ground conductor patterns 1340a, 1340c, 1340d, and 1340f, respectively.

Therefore, the crosstalk between the signal conductor patterns 330a and the signal conductor pattern 330b and between the signal conductor pattern 330c and the signal conductor pattern 330d due to the leaked microwaves is reduced.

Ninth Modification Example

Figure 13:
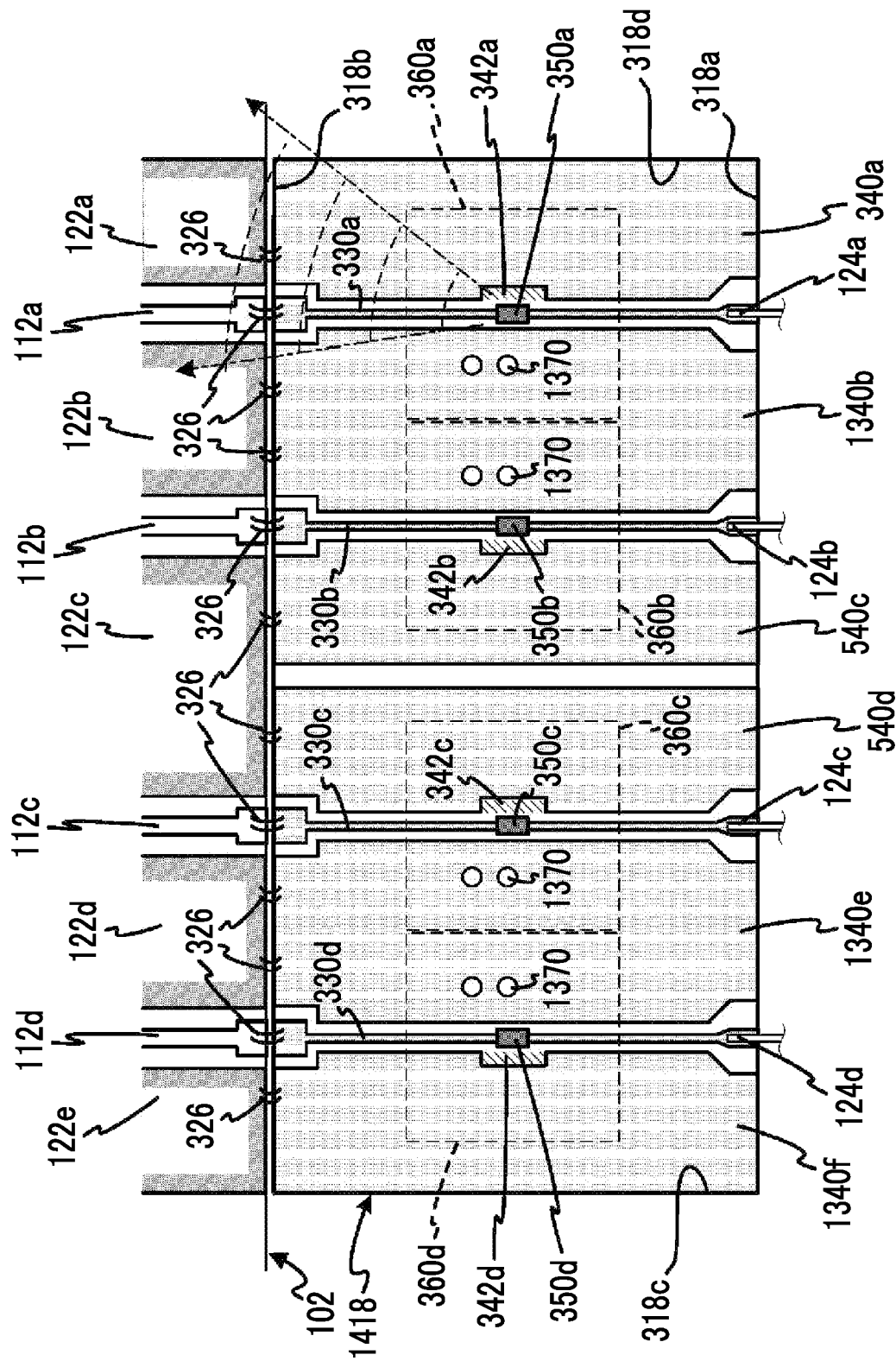
FIG. 13 is a diagram illustrating a configuration of a relay substrate according to a ninth modification example of the optical modulator according to the first embodiment.

FIG. 13 is a diagram illustrating a configuration of a relay substrate 1418 according to a ninth modification example, and is a diagram corresponding to the partial detailed view of the first embodiment illustrated in FIG. 3. The relay substrate 1418 can be used instead of the relay substrate 118 in the optical modulator 100 illustrated in FIG. 1, similar to the relay substrates 518 and 1318 of the first modification example and the eighth modification example illustrated in FIGS. 5 and 12.

In FIG. 13, the same reference numerals as those in FIGS. 3, 5, and 12 are used for the same components as those of the components of the relay substrates 118, 518, and 1318 illustrated in FIGS. 3, 5, and 12, and the above descriptions of FIGS. 3, 5, and 12 will be incorporated herein.

The relay substrate 1318 has the same configuration as the relay substrate 118 illustrated in FIG. 3, but includes the ground conductor patterns 1340b and 1340e of the relay substrate 1318 of the eighth modification example illustrated in FIG. 12 instead of the ground conductor patterns 340b and 340e, and includes the ground conductor patterns 540c and 540d of the relay substrate 518 of the first modification example illustrated in FIG. 5 instead of the ground conductor patterns 340c and 340d.

Thus, in the relay substrate 1418, similar to the relay substrate 1318 illustrated in FIG. 12, since the vias 1370 are provided only on one ground conductor pattern in the component mounting area 360, it has an effect of reducing crosstalk between the signal conductor patterns 330. Further, in the relay substrate 1418, since notches 342a, 342b, 342c, and 342d in the relay substrate 518 illustrated in FIG. 5 are also formed, an even higher crosstalk reduction effect than that of the relay substrate 1318 illustrated in FIG. 12 is exhibited.

Second Embodiment

Next, a second embodiment of the present invention will be described. The present embodiment provides an optical transmission apparatus on which any optical modulator of the optical modulator 100 according to the first embodiment and the optical modulators 100 using the relay substrates 518, 718, 818, 918, 1018, 1118, 1218, 1318, and 1418 according to the modification examples is mounted.

Figure 14:
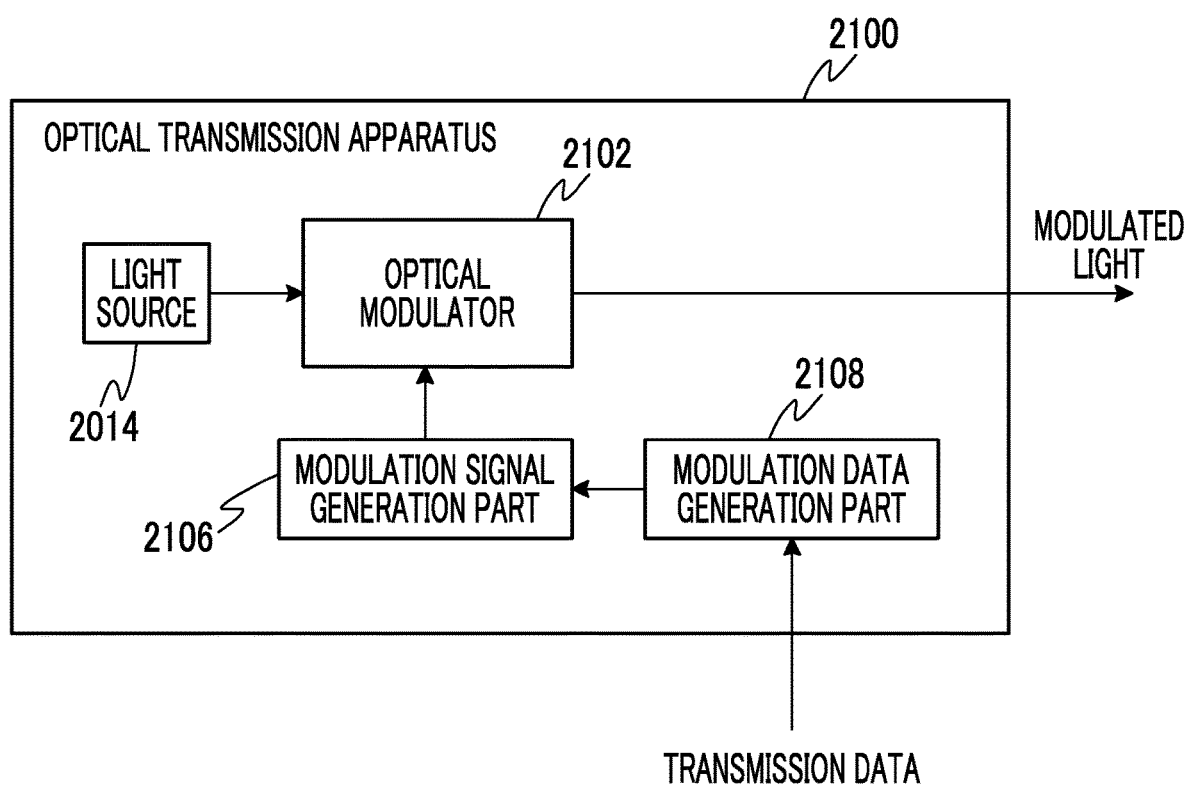
FIG. 14 is a diagram illustrating a configuration of an optical transmission apparatus according to a second embodiment of the present invention.
Figure 15:
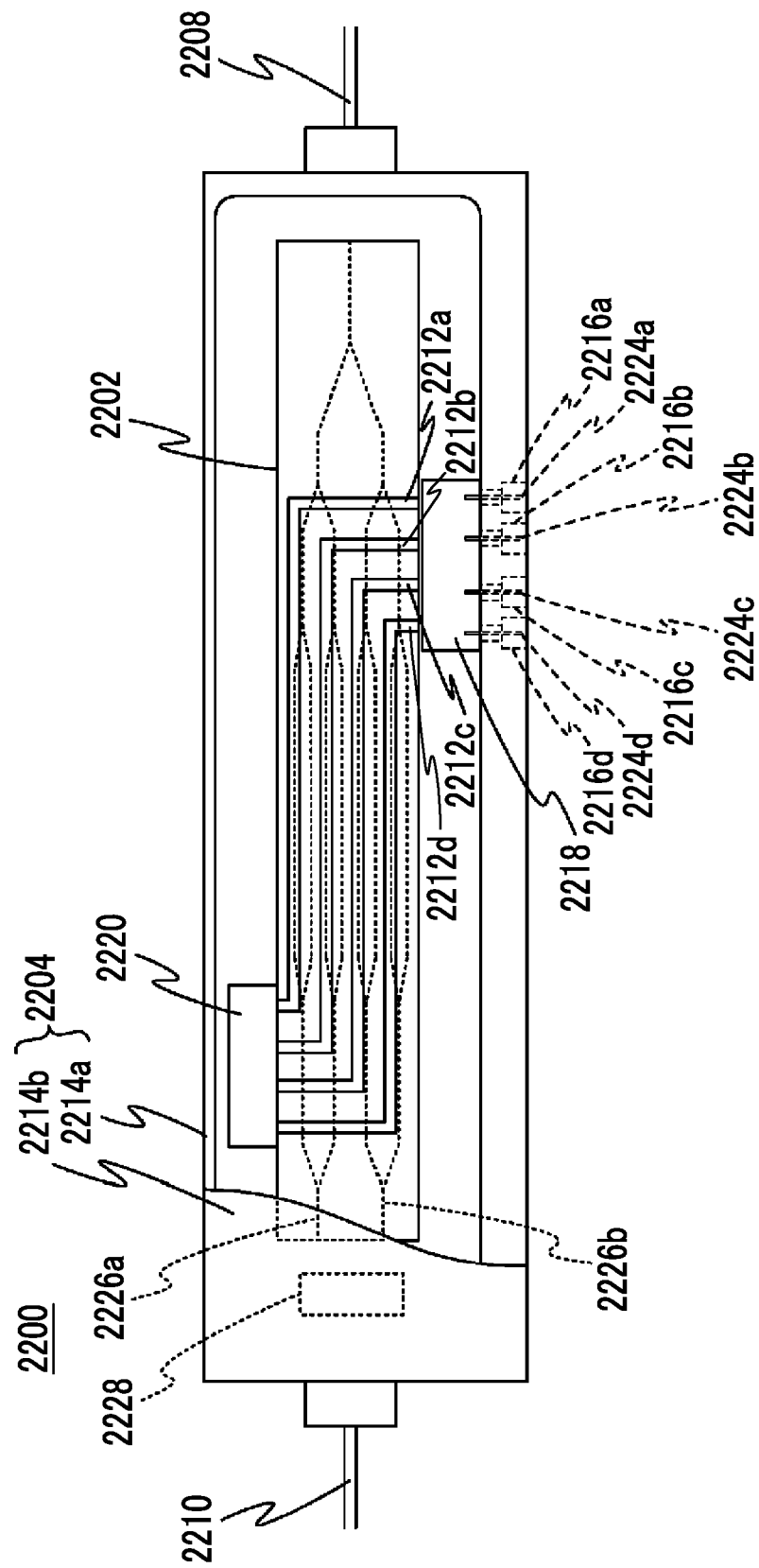
FIG. 15 illustrates an example of a configuration of an optical modulator in the related art.
Figure 16:
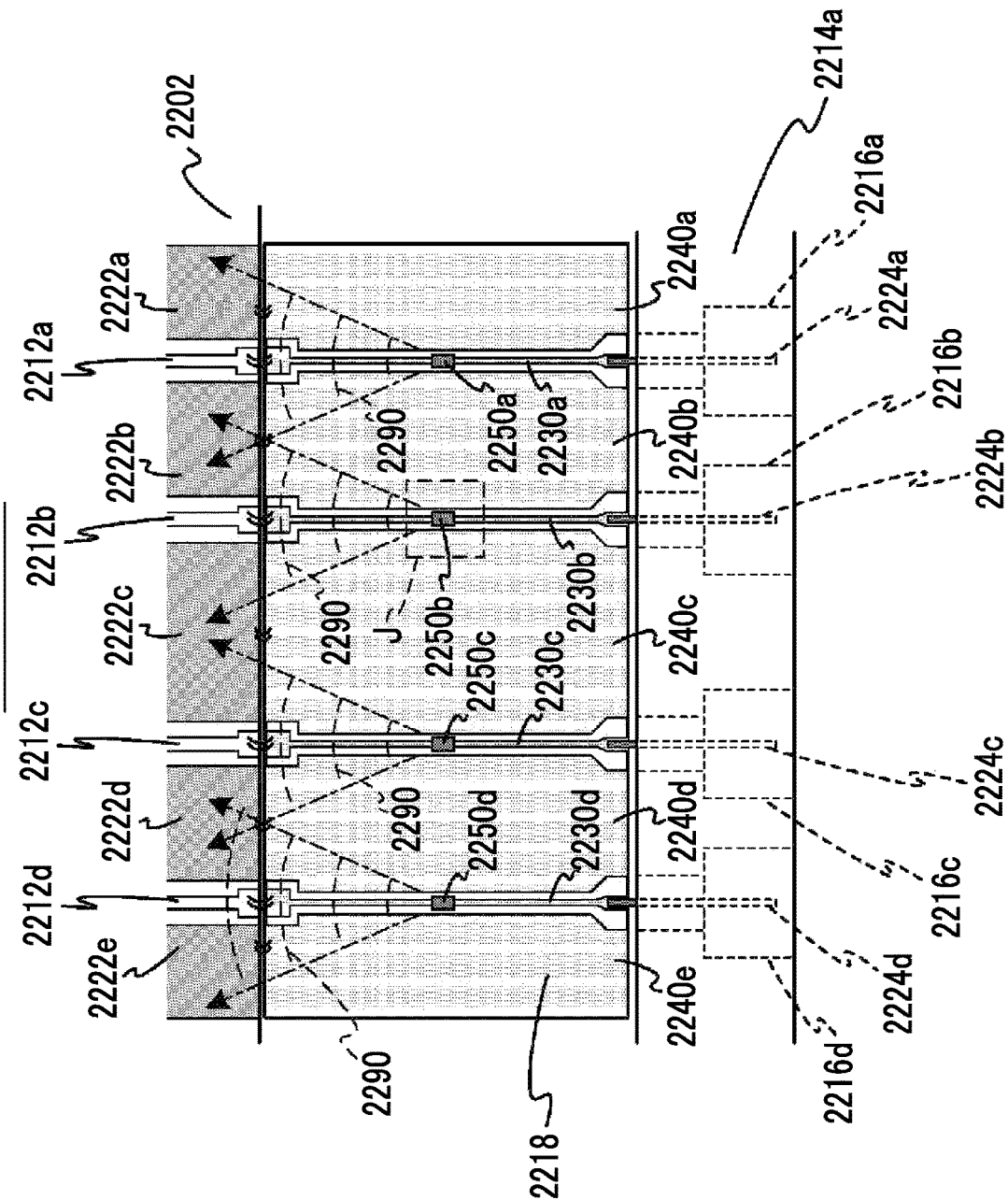
FIG. 16 is a partial detailed view illustrating the periphery of a relay substrate in the optical modulator in the related art.

FIG. 14 is a diagram illustrating a configuration of an optical transmission apparatus according to the present embodiment. An optical transmission apparatus 2100 includes an optical modulator 2102, a light source 2104 that inputs light to the optical modulator 2102, a modulation signal generation part 2106, and a modulation data generation part 2108.

The optical modulator 2102 can be any optical modulator of the optical modulator 100 according to the first embodiment and the optical modulators 100 using the relay substrates 518, 718, 818, 918, 1018, 1118, 1218, 1318, and 1418 according to the modification examples described above. Here, in order to avoid redundant description and facilitate understanding, in the following description, the optical modulator 2102 is assumed to be the optical modulator 100 according to the first embodiment.

The modulation data generation part 2108 receives transmission data given from the outside, generates modulation data for transmitting the transmission data (for example, data obtained by converting or processing transmission data into a predetermined data format), and outputs the generated modulation data to the modulation signal generation part 2106.

The modulation signal generation part 2106 is an electronic circuit (drive circuit) that outputs an electrical signal for causing the optical modulator 2102 to perform a modulation operation, generates a modulation signal which is a high-frequency signal for making the optical modulator 2102 perform an optical modulation operation according to the modulation data, based on the modulation data which is output by the modulation data generation part 2108, and inputs the generated modulation signal to the optical modulator 2102. The modulation signal includes four high-frequency electrical signals corresponding to the four signal electrodes 112a, 112b, 112c, and 112d of the optical modulation element 102 provided in the optical modulator 2102. Here, the high-frequency electrical signals input to the signal electrodes 112a and 112b form a pair, and output light output from one output optical waveguide 126a of the optical modulation element 102 is modulated.

Further, the high-frequency electrical signals input to the signal electrodes 112c and 112d form the other pair, and output light output from the other output optical waveguide 126b of the optical modulation element 102 is modulated.

The four high-frequency electrical signals are input from the signal input terminals 124a, 124b, 124c, and 124d of the respective electrical connectors 116a, 116b, 116c, and 116d of the optical modulator 2102 to the signal conductor patterns 330a, 330b, 330c, and 330d on the relay substrate 118, and are input to the signal electrodes 112a, 112b, 112c, and 112d of the optical modulation element 102 via the signal conductor pattern 330a or the like.

Thus, the light output from the light source 2104 is, for example, DP-QPSK modulated by the optical modulator 2102 and output as modulated light from the optical transmission apparatus 2100.

In particular, in the optical transmission apparatus 2100, as the optical modulator 2102, any optical modulator of the optical modulator 100 according to the first embodiment and the optical modulators 100 using the relay substrates 518, 718, 818, 918, 1018, 1118, 1218, 1318, and 1418 according to the modification examples is used. Therefore, in the optical transmission apparatus 2100, it is possible to effectively reduce an increase in crosstalk between the high-frequency electrical signals for driving the optical modulation element 102 due to the above-described space leaked microwaves, particularly, crosstalk due to space leaked microwaves between the signal lines propagating the two paired high-frequency electrical signals. Therefore, in the optical transmission apparatus 2100, it is possible to ensure stable and appropriate optical modulation characteristics, and to realize stable and appropriate transmission characteristics.

The present invention is not limited to the configurations of the embodiments and the modification examples described above, and can be realized in various aspects without departing from the spirit thereof.

For example, in the above-mentioned relay substrates 118, 518, 718, 818, 918, 1018, 1118, 1218, 1318, and 1418, it is assumed that a portion in which the two ground conductor patterns 340 are formed asymmetrically with each other is included in the component mounting area 360 of two or more signal conductor patterns 330, but the present invention is not limited thereto. In any of the configurations of the relay substrates 118, 518, 718, 818, 918, 1018, 1118, 1218, 1318, and 1418, it is possible to include a portion in which the two ground conductor patterns 340 are formed asymmetrically with each other in the component mounting area 360 of the at least one signal conductor pattern 330 according to the generation state of the leaked microwave in the relay substrate 118 or the like.

Further, in the first embodiment and the modification examples thereof described above, it is assumed that all of the signal conductor patterns 330 are provided with one component mounting portion 350, but the present invention is not limited thereto. The component mounting portion 350 may be provided in at least one signal conductor pattern 330, or a plurality of component mounting portions 350 may be provided for one signal conductor pattern 330. That is, at least one signal conductor pattern 330 may be provided with at least one component mounting portion 350.

Further, the number of vias formed in the ground conductor pattern of the relay substrates 1018, 1118, 1218, 1318, and 1418 illustrated in FIGS. 9, 10, 11, 12, and 13 is an example, and the present invention is not limited thereto. Any number and size of vias may be provided in any manner as long as the gist of the above-mentioned characteristic configurations is not exceeded for FIGS. 9, 10, 11, 12, and 13. For example, in the relay substrate 1018 according to the fifth modification example illustrated in FIG. 9, the two ground conductor patterns may be provided with any number and size of vias in any manner as long as the numbers and diameters of the vias provided in the two ground conductor patterns are different from each other in the component mounting area 360.

Further, the characteristic configurations of the relay substrate 118, 518, and the like according to the first embodiment and the modification examples thereof described above can be combined in any manner to form one relay substrate. For example, the characteristic configuration in which the propagation direction of the leaked microwaves is biased due to the asymmetry of the vias illustrated in FIG. 9 can be combined with the configuration illustrated in FIG. 3 to form one relay substrate. Further, the recess portion 942 of the relay substrate 918 of the fourth modification example illustrated in FIG. 8 or the recess portion 1276 of the relay substrate 1218 of the seventh modification example illustrated in FIG. 11 may be applied to the relay substrate according to another modification example to reduce the impedance fluctuation of the signal conductor pattern 330 due to the displacement of the mounting position of the electrical circuit element in the component mounting portion 350.

Further, in the above-described embodiment, the optical modulation element 102 is a DP-QPSK modulator configured by using an LN substrate, but the present invention is not limited thereto. For example, the optical modulation element 102 may be any optical modulation element configured by using a semiconductor substrate.

Further, in the above-described embodiment, the optical modulation element 102, the relay substrate 118, and the like are accommodated in the housing 104, but in addition to these, an electronic circuit element (driver element) for operating the optical modulation element 102 may also be accommodated in the housing 104.

As described above, the optical modulator 100 according to the above-described embodiment includes the optical modulation element 102 including a plurality of signal electrodes 112, a plurality of signal input terminals 124 for inputting electrical signals to be respectively applied to the signal electrode 112, the relay substrate 118, and the housing 104 in which the optical modulation element 102 and the relay substrate 118 are accommodated. The relay substrate 118 is formed with a plurality of signal conductor patterns 330 that electrically connect the signal input terminals 124 to the signal electrodes 112, and a plurality of ground conductor patterns 340. At least one signal conductor pattern 330 includes at least one component mounting portion 350 including an electrical circuit element. The two ground conductor patterns 340 sandwiching the at least one signal conductor pattern 330 on the relay substrate 118 are formed in an asymmetrical shape in a plan view with respect to the at least one signal conductor pattern 330, in the component mounting area 360 having a square shape in the plan view centered on the component mounting portion 350. Here, the component mounting area 360 is an area having the square shape in the plan view in which a direction of a side is same as the extending direction of the at least one signal conductor pattern 330 in the component mounting portion 350 and a length of a side is equal to a distance from the at least one signal conductor pattern 330 to the closest adjacent signal conductor pattern 330.

Further, as illustrated by an example in the relay substrate 1018, 1318, or the like, two ground conductor patterns (for example, 1040a and 1040b or 1340a and 1340b) sandwiching the at least one signal conductor pattern 330 are formed asymmetrically in the component mounting area 360 having the square shape in the plan view centered on the component mounting portion 350 in terms of a presence or absence of vias, diameters of vias, or the numbers of vias to be different from each other.

According to these configurations, it is possible to bias the propagation direction of the leaked microwaves that may be generated from the component mounting portion 350 provided with the electrical circuit element in the relay substrate 118, to suppress the crosstalk between the signal conductor patterns 330, and to realize appropriate optical modulation characteristics.

Further, as illustrated by an example as the notched portion 342a or the like in the relay substrate 118, 518, or the like, the two ground conductor patterns sandwiching at least one signal conductor pattern 330 are formed to have portions in which distances from respective edges of the two ground conductor patterns to opposite edges of the at least one signal conductor pattern 330 are different from each other in the component mounting area 360.

According to the configurations, simply by changing the shape of the ground conductor pattern, it is possible to easily bias the propagation direction of the leaked microwaves generated from the component mounting portion 350, to suppress the crosstalk between the signal conductor patterns 330, and to realize appropriate optical modulation characteristics.

Further, as illustrated by an example as the narrow portion 1174a or the like in the relay substrate 1118, or the like, one of the two ground conductor patterns sandwiching at least one signal conductor pattern 330 includes a narrow portion in which a width measured in the direction orthogonal to the extending direction of the at least one signal conductor pattern 330 is narrower than that of the other of the two ground conductor patterns, in the component mounting area 360.

According to the configuration, it is possible to strengthen the bias in the propagation direction of the leaked microwaves generated from the component mounting portion 350, to suppress the crosstalk between the signal conductor patterns 330, and to realize appropriate optical modulation characteristics.

Further, as illustrated as an example as the section 742a or the like in the relay substrate 818 or the like, one of the two ground conductor patterns sandwiching at least one signal conductor pattern 330 has a discontinuous section in the component mounting area 360.

According to the configuration, it is possible to further strengthen the bias in the propagation direction of the leaked microwaves generated from the component mounting portion 350, to suppress the crosstalk between the signal conductor patterns 330, and to realize further appropriate optical modulation characteristics.

Further, as illustrated by an example as the recess portion 942a, 1276a, or the like in the relay substrates 918 and 1218, the other ground conductor pattern that does not include the narrow portion or the discontinuous section, of the two ground conductor patterns sandwiching the at least one signal conductor pattern 330, is formed such that a separation distance to the signal conductor pattern 330 in the component mounting portion 350 is longer than a separation distance to the signal conductor pattern 330 in the portion other than the component mounting portion 350.

According to this configuration, the change in the characteristic impedance of the signal conductor pattern 330 due to the displacement of the mounting position of the electrical circuit element in the component mounting portion 350 is suppressed, and it is possible to suppress crosstalk between the signal conductor patterns 330 while reducing manufacturing variations and realize appropriate optical modulation characteristics.

Further, the optical modulator 100 can use, for example, the optical modulation element 102 that performs DP-QPSK modulation, which is configured to generate two modulated light beams, each of which is modulated by a pair of electrical signals, and the relay substrate 118 and the like may be configured to propagate the pair of electrical signals by a pair of signal conductor patterns adjacent to each other, for example, the signal conductor patterns 330a and 330b.

With this configuration, crosstalk propagated by the adjacent signal conductor patterns 330 between the two paired high-frequency electrical signals can be effectively reduced, so that it is possible to realize appropriate optical modulation characteristics.

Further, the optical transmission apparatus according to the second embodiment described above includes the modulation operation on the optical modulator 100 using any of the relay substrates described in the first embodiment or the modification examples thereof, the modulation signal generation part 2106 which is an electronic circuit that outputs an electrical signal for causing the optical modulator 100 to perform a modulation operation, and the like. With this configuration, for example, the propagation of leaked microwaves, which becomes noticeable as the transmission rate is increased, is suppressed and crosstalk and the like between a plurality of high-frequency electrical signals that drive the optical modulation element 102 is effectively reduced, so it is possible to realize stable and appropriate transmission characteristics.

REFERENCE SIGNS LIST 100, 2102, 2200 . . . optical modulator
102, 2202 . . . optical modulation element
104, 1604, 2204 . . . housing
108, 2208 . . . input optical fiber 110, 2210 . . . output optical fiber
112, 112a, 112b, 112c, 112d, 2212, 2212a, 2212b, 2212c, 2212d . . . signal electrode
114a, 2214a . . . case
114b, 2214b . . . cover
116, 116a, 116b, 116c, 116d, 2216, 2216a, 2216b, 2216c, 2216d . . . electrical connector
118, 518, 618, 718, 818, 918, 1018, 1118, 1218, 1318, 1418, 2218 . . . relay substrate
120, 2220 . . . terminator
122, 122a, 122b, 122c, 122d, 122e, 2222a, 2222b, 2222c, 2222d, 2222e . . . ground electrode
124, 124a, 124b, 124c, 124d, 2224, 2224a, 2224b, 2224c, 2224d . . . signal input terminal
126a, 126b . . . output optical waveguide
318a . . . signal input side
318b . . . signal output side
318c, 318d . . . side edge
326, 2270 . . . conductor wire
330, 330a, 330b, 330c, 330d, 2230, 2230a, 2230b, 2230c, 2230d . . . signal conductor pattern
340, 340a, 340b, 340c, 340d, 340e, 340f, 540c, 540d, 740a, 740f, 840c, 840d, 940b, 940e, 1040a, 1040b, 1040c, 1040d, 1040e, 1040f, 1140a, 1140c, 1140d, 1140f, 1240a, 1240b, 1240c, 1240d, 1240e, 1240f, 1340a, 1340b, 1340c, 1340d, 1340e, 1340f, 2240a, 2240b, 2240c, 2240d, 2240e . . . ground conductor pattern
342a, 342b, 342c, 342d . . . notched portion
350a, 350b, 350c, 350d, 2250a, 2250b, 2250c, 2250d . . . component mounting portion
352a, 352b . . . electrical circuit element
360a, 360b, 360c, 360d, 2260a, 2260b, 2260c, 2260d . . . component mounting area
362a . . . shape center
362b . . . propagation direction
742a, 742d, 842b, 842c . . . section
942, 942a, 942b, 942c, 942d, 1276, 1276a, 1276b, 1276c, 1276d . . . recess portion
1070, 1072, 1370 . . . via
1174a, 1174b, 1174c, 1174d, 1274a, 1274b, 1274c, 1274d . . . narrow portion
2100 . . . optical transmission apparatus
2104 . . . light source
2106 . . . modulation signal generation part
2108 . . . modulation data generation part
2252b . . . thin film resistor
2254b . . . capacitor
2290 . . . leaked microwave

The invention claimed is:

1. An optical modulator comprising:
an optical modulation element that includes a plurality of signal electrodes;
a plurality of signal input terminals each of which inputs an electrical signal to be applied to each of the signal electrodes;
a relay substrate on which a plurality of signal conductor patterns that electrically connect the signal input terminals to the signal electrodes, and a plurality of ground conductor patterns are formed; and
a housing in which the optical modulation element and the relay substrate accommodated,
wherein at least one signal conductor pattern includes at least one component mounting portion including an electrical circuit element,
two ground conductor patterns sandwiching the at least one signal conductor pattern on the relay substrate are formed in an asymmetrical shape in a plan view within a component mounting area having a square shape in the plan view centered on the component mounting portion, with respect to a straight line extending in an extending direction of the at least one signal conductor pattern in the component mounting portion, and
a direction of a side of the component mounting area having the square shape is same as the extending direction of the at least one signal conductor pattern in the component mounting portion and a length of a side of the component mounting area is equal to a distance from a center of the component mounting portion to a portion on an adjacent signal conductor pattern closest to the center.

2. An optical transmission apparatus comprising:
the optical modulator according to claim 1; and
an electronic circuit that outputs an electrical signal for causing the optical modulator to perform a modulation operation.

3. The optical modulator according to claim 1,
wherein the two ground conductor patterns are formed to have portions in which distances from respective edges of the two ground conductor patterns to opposite edges of the at least one signal conductor pattern are different from each other in the component mounting area.

4. The optical modulator according to claim 1,
wherein one ground conductor pattern of the two ground conductor patterns includes a portion in which a width measured in a direction orthogonal to the extending direction of the at least one signal conductor pattern is narrower than a width of an other ground conductor pattern of the two ground conductor patterns, in the component mounting area.

5. The optical modulator according to claim 4,
wherein the other ground conductor pattern of the two ground conductor patterns has a portion in which a separation distance to a portion of the signal conductor pattern constituting the component mounting portion is formed longer than a separation distance to other portions of the signal conductor pattern within a corresponding component mounting area.

6. The optical modulator according to claim 1,
wherein one ground conductor pattern of the two ground conductor patterns has a discontinuous section in the component mounting area, and an other ground conductor pattern does not have a discontinuous section in the component mounting area.

7. The optical modulator according to claim 6,
wherein the other ground conductor pattern of the two ground conductor patterns has a portion in which a separation distance to a portion of the signal conductor pattern constituting the component mounting portion is formed longer than a separation distance to other portions of the signal conductor pattern within a corresponding component mounting area.

8. The optical modulator according to claim 1,
wherein the optical modulation element is configured to generate two modulated light beams, each of which is modulated by a pair of the electrical signals, and
the relay substrate is configured to propagate the pair of electrical signals by a pair of the signal conductor patterns adjacent to each other.

9. An optical modulator comprising:
an optical modulation element that includes a plurality of signal electrodes;
a plurality of signal input terminals each of which inputs an electrical signal to be applied to each of the signal electrodes;
a relay substrate on which a plurality of signal conductor patterns that electrically connect the signal input terminals to the signal electrodes, and a plurality of ground conductor patterns are formed; and
a housing in which the optical modulation element and the relay substrate are accommodated,
wherein at least one signal conductor pattern includes at least one component mounting portion including an electrical circuit element,
two ground conductor patterns sandwiching the at least one signal conductor pattern on the relay substrate are formed asymmetrically within a component mounting area having a square shape in the plan view centered on the component mounting portion, in terms of a presence or absence of vias, diameters of vias, or the numbers of vias, and
a direction of a side of the component mounting area having the square shape is same as the extending direction of the at least one signal conductor pattern in the component mounting portion and a length of a side of the component mounting area is equal to a distance from the at least one signal conductor pattern to a closest adjacent signal conductor pattern.

10. The optical modulator according to claim 9, wherein one ground conductor pattern of the two ground conductor patterns includes a portion in which a width measured in a direction orthogonal to the extending direction of the at least one signal conductor pattern is narrower than a width of an other ground conductor pattern of the two ground conductor patterns, in the component mounting area.

11. The optical modulator according to claim 10, wherein the other ground conductor pattern of the two ground conductor patterns has a portion in which a separation distance to a portion of the signal conductor pattern constituting the component mounting portion is formed longer than a separation distance to other portions of the signal conductor pattern within a corresponding component mounting area.

12. The optical modulator according to claim 9, wherein the two ground conductor patterns are formed to have portions in which distances from respective edges of the two ground conductor patterns to opposite edges of the at least one signal conductor pattern are different from each other in the component mounting area.

13. The optical modulator according to claim 9, wherein one ground conductor pattern of the two ground conductor patterns has a discontinuous section in the component mounting area, and an other ground conductor pattern does not have a discontinuous section in the component mounting area.

14. The optical modulator according to claim 13, wherein the other ground conductor pattern of the two ground conductor patterns has a portion in which a separation distance to a portion of the signal conductor pattern constituting the component mounting portion is formed longer than a separation distance to other portions of the signal conductor pattern within a corresponding component mounting area.

15. The optical modulator according to claim 9, wherein the optical modulation element is configured to generate two modulated light beams, each of which is modulated by a pair of the electrical signals, and
the relay substrate is configured to propagate the pair of electrical signals by a pair of the signal conductor patterns adjacent to each other.

16. An optical transmission apparatus comprising:
the optical modulator according to claim 9; and
an electronic circuit that outputs an electrical signal for causing the optical modulator to perform a modulation operation.

* * * * *